(12) United States Patent
Lee et al.

(10) Patent No.: US 9,892,672 B2
(45) Date of Patent: Feb. 13, 2018

(54) TRANSPARENT DISPLAY DEVICE AND TRANSPARENT DISPLAY PANEL

(71) Applicant: LG DISPLAY CO., LTD., Seoul (KR)

(72) Inventors: BuYeol Lee, Goyang-si (KR); EuiTae Kim, Paju-si (KR); Hyoung-Su Kim, Anyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/983,009

(22) Filed: Dec. 29, 2015

(65) Prior Publication Data

US 2016/0321982 A1 Nov. 3, 2016

(30) Foreign Application Priority Data

Apr. 28, 2015 (KR) .................. 10-2015-0059482

(51) Int. Cl.
| | |
|---|---|
| G09G 3/20 | (2006.01) |
| G09G 3/3233 | (2016.01) |
| G09G 3/3291 | (2016.01) |
| G09G 3/36 | (2006.01) |
| H01L 27/32 | (2006.01) |

(52) U.S. Cl.
CPC ......... *G09G 3/2074* (2013.01); *G09G 3/3003* (2013.01); *G09G 3/3233* (2013.01); *G09G 3/3291* (2013.01); *G09G 3/3607* (2013.01); *G09G 3/3688* (2013.01); *H01L 27/326* (2013.01); *H01L 27/3218* (2013.01); *H01L 27/3276* (2013.01); *G09G 2300/0426* (2013.01); *G09G 2300/0443* (2013.01); *G09G 2300/0452* (2013.01); *G09G 2300/0465* (2013.01); *G09G 2300/0809* (2013.01); *G09G 2300/0842* (2013.01); *G09G 2310/0202* (2013.01); *G09G 2320/028* (2013.01); *H01L 27/3216* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,852,450 B2 * | 12/2010 | Kim | ................... | G02F 1/13394 349/106 |
| 2011/0147770 A1 | 6/2011 | Hwang et al. | | |
| 2013/0113843 A1 | 5/2013 | Yamazaki | | |
| 2015/0357383 A1 * | 12/2015 | Chung | ................ | H01L 27/3297 257/40 |
| 2016/0197124 A1 * | 7/2016 | Kim | ..................... | H01L 27/3218 257/40 |

\* cited by examiner

*Primary Examiner* — Robin Mishler
(74) *Attorney, Agent, or Firm* — Birch, Stewart, Kolasch & Birch, LLP

(57) ABSTRACT

The present embodiments relate to a transparent display panel having an excellent transparency, light-emitting efficiency, and viewing angle, and a transparent display device including the same.

17 Claims, 18 Drawing Sheets

TRANSPARENT DISPLAY DEVICE AND TRANSPARENT DISPLAY PANEL

CROSS-REFERENCE TO RELATED APPLICATION

This application claims priority from and the benefit under 35 U.S.C. § 119(a) of Korean Patent Application No. 10-2015-0059482, filed on Apr. 28, 2015, which is hereby incorporated by reference for all purposes as if fully set forth herein.

BACKGROUND OF THE INVENTION

Field of the Invention

The present invention relates to a transparent display device and a transparent display panel.

Description of the Related Art

As the information society develops, display devices for displaying an image are being increasingly required in various forms, and various display devices such as Liquid Crystal Display (LCD) devices, Plasma Display Panel (PDP) devices, and Organic Light Emitting Display (OLED) devices are utilized.

Further, a transparent display device using a transparent material and a transparent display panel therefor are starting to be required.

However, a change in the panel design, which is intended for enhancement of the transparency of the transparent display panel, may reduce the light-emitting area, thereby degrading the light emission efficiency. In contrast, if the light emission efficiency is raised by increasing the light-emitting area, the transparency is lowered to prevent the panel from properly functioning as a transparent display panel.

As a result, a transparent display panel and a transparent display device including the panel have not been commercialized yet.

SUMMARY OF THE INVENTION

An aspect of the embodiments of the present invention is to provide a transparent display panel and a transparent display device including the panel, which have a structure capable of securing a wide light-emitting area without degrading the transparency thereof.

Another aspect of the embodiments of the present invention is to provide a transparent display panel and a transparent display device including the panel, which have a light-emitting part arrangement structure allowing a wide transparent area and a wide light-emitting area.

Another aspect of the embodiments of the present invention is to provide a transparent display panel and a transparent display device including the panel, which have a line arrangement structure allowing a wide transparent area and a wide light-emitting area.

Another aspect of the embodiments of the present invention is to provide a transparent display panel and a transparent display device including the panel, which have a circuit part arrangement structure allowing a wide transparent area and a wide light-emitting area.

Another aspect of the embodiments of the present invention is to provide a transparent display panel and a transparent display device including the panel, which can widen the viewing angle while allowing a wide transparent area and a wide light-emitting area.

Another aspect of the embodiments of the present invention is to provide a transparent display panel and a transparent display device including the panel, which can widen the viewing angle while allowing a wide transparent area and a wide light-emitting area, even without a change in another structure such as a cell gap.

Another aspect of the embodiments of the present invention is to provide a transparent display panel and a transparent display device including the panel, which have an RG-BG structure capable of improving the light-emitting efficiency, viewing angle characteristic, and transparency.

The present embodiments may provide a transparent display device, which includes a transparent display panel in which a plurality of sub-pixels including a light-emitting part and a circuit part are arranged, and a driver for driving the plurality of sub-pixels.

The transparent display panel can include a plurality of transparent parts arranged in a form of a matrix and column lines arranged in a column line area between transparent part columns. The matrix includes a plurality of transparent part columns and transparent part rows. Each transparent part column includes a plurality of transparent parts and optionally non-transparent parts (in which one or more sub-pixels may be located or which may overlap with one or more sub-pixels) arranged along a column of the matrix. The non-transparent parts may be interposed between respective two transparent parts. Furthermore, each transparent part row includes a plurality of transparent parts and optionally non-transparent parts (in which one or more sub-pixels may be located or which may overlap with one or more sub-pixels) arranged along a row of the matrix.

In various embodiments, a transparent display device is provided. The transparent display device includes a transparent display panel in which a plurality of pixels are arranged, each pixel comprising a plurality of sub-pixels including a light-emitting part and a circuit part, and a driver for driving the plurality of sub-pixels. The transparent display panel includes a plurality of transparent parts arranged in a form of a matrix, thereby forming a plurality of transparent part columns, column lines arranged in a column line area between adjacent transparent part columns. The light-emitting part of a sub-pixel of at least one color is located in or overlaps the column line area.

The sub-pixel of the at least one color which is located in or overlaps the column line area may form an angle with at least one sub-pixel located in a first transparent part column.

The sub-pixel of the at least one color which is located in or overlaps the column line area may run substantially perpendicular to the at least one sub-pixel located in the first transparent part column.

Respective two pixels may be formed by four sub-pixels. At least one first sub-pixel of a second color may be located in a first transparent part column of a first pixel of the two pixels and at least one second sub-pixel of a third color may be located in a second transparent part column of a second pixel of the two pixels. The second transparent part column may be arranged adjacent to the first transparent part column. The sub-pixel of the at least one color which may be located in or may overlap the column line area may include a first sub-pixel of a first color located in or overlapping a first column line area between the first transparent part column and the second transparent part column and may include a second sub-pixel of the first color located in or overlapping a second column line area adjacent the first transparent part column and opposite the second transparent part column.

At least a portion of the light-emitting part of a sub-pixel of at least one color overlapping with at least a portion of the column lines may be free of a black matrix.

Furthermore, the sub-pixel of at least one color located in or overlapping the column line area may be a first sub-pixel, and at least one sub-pixel located in the transparent part column may be a second sub-pixel.

Moreover, the first sub-pixel may be of a first color and the second sub-pixel may be of a second color different from the first color.

The transparent display device may further include a third sub-pixel of a third color located in a second transparent part column adjacent to the first transparent part column.

The transparent display device may further include a third sub-pixel of a third color located in or overlapping a further column line area arranged at the opposite side of the first transparent part column as the column line area. The third sub-pixel may be arranged adjacent to the second sub-pixel. The first color may be green, the second color may be red, and the third color may be blue. Furthermore, the first color may be blue, the second color may be green, and the third color may be red.

The area of the first sub-pixel may be larger than the area of the second sub-pixel and/or the third sub-pixel.

The column lines may be arranged in an opaque column line area between adjacent transparent part columns.

Respective two pixels may be formed by four sub-pixels.

In each sub-pixel, the respective light-emitting part may be disposed over the respective circuit part.

A circuit part of the first sub-pixel may be disposed below the second sub-pixel.

The transparent display panel may include a plurality of transparent parts arranged in the form of a matrix, thereby forming a plurality of transparent part columns and a plurality of transparent part rows. The plurality of sub-pixels of at least some of the pixels may be arranged in one common row. A respective sub-pixel of a first color may be arranged between two transparent part rows. A respective sub-pixel of a second color may be located in or overlapping a first column line area between a first transparent part column in which the sub-pixel of the first color is located and opposite a second transparent part column which is adjacent to the first transparent part column. A respective sub-pixel of a third color may be located in or overlapping a second column line area between the first transparent part column and the second transparent part column.

Further, in the transparent display panel of the transparent display device, a light-emitting part of a sub-pixel of at least one color is located in or overlaps the column line area.

As an example, a first color light-emitting part corresponding to a light-emitting part of a first color sub-pixel may be located on column lines arranged in the column line area, and a second color light-emitting part corresponding to a light-emitting part of a second color sub-pixel and a third color light-emitting part corresponding to a light-emitting part of a third color sub-pixel may be located between each of transparent part rows.

As another example, a first color light-emitting part corresponding to a light-emitting part of a first color sub-pixel may be located between transparent part rows, and a second color light-emitting part of a second color sub-pixel and a third color light-emitting part of a third color sub-pixel may be located on column lines arranged in the column line area.

The present embodiments may provide a transparent display panel, which includes a plurality of transparent parts arranged in a form of a matrix, column lines arranged in a column line area between transparent part columns, a first color sub-pixel including a first color light-emitting part and a first color circuit part, a second color sub-pixel including a second color light-emitting part and a second color circuit part, and a third color sub-pixel including a third color light-emitting part and a third color circuit part.

In the transparent display panel, at least one of the first color light-emitting part, the second color light-emitting part, and the third color light-emitting part may be located in or may overlap the column line area.

The embodiments of the present invention can provide a transparent display panel and a transparent display device including the panel, which have a structure capable of securing a wide light-emitting area without degrading the transparency thereof.

The embodiments of the present invention can provide a transparent display panel and a transparent display device including the panel, which have a light-emitting part arrangement structure allowing a wide transparent area and a wide light-emitting area.

The embodiments of the present invention can provide a transparent display panel and a transparent display device including the panel, which have a line arrangement structure allowing a wide transparent area and a wide light-emitting area.

The embodiments of the present invention can provide a transparent display panel and a transparent display device including the panel, which have a circuit part arrangement structure allowing a wide transparent area and a wide light-emitting area.

The embodiments of the present invention can provide a transparent display panel and a transparent display device including the panel, which can widen the viewing angle while allowing a wide transparent area and a wide light-emitting area.

The embodiments of the present invention can provide a transparent display panel and a transparent display device including the panel, which can widen the viewing angle while allowing a wide transparent area and a wide light-emitting area, even without a change in another structure such as a cell gap.

Further, the embodiments of the present invention can provide a transparent display panel and a transparent display device including the panel, which have an RG-BG structure capable of improving the light-emitting efficiency, viewing angle characteristic, and transparency.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE EXEMPLARY EMBODIMENTS

Figure 1:
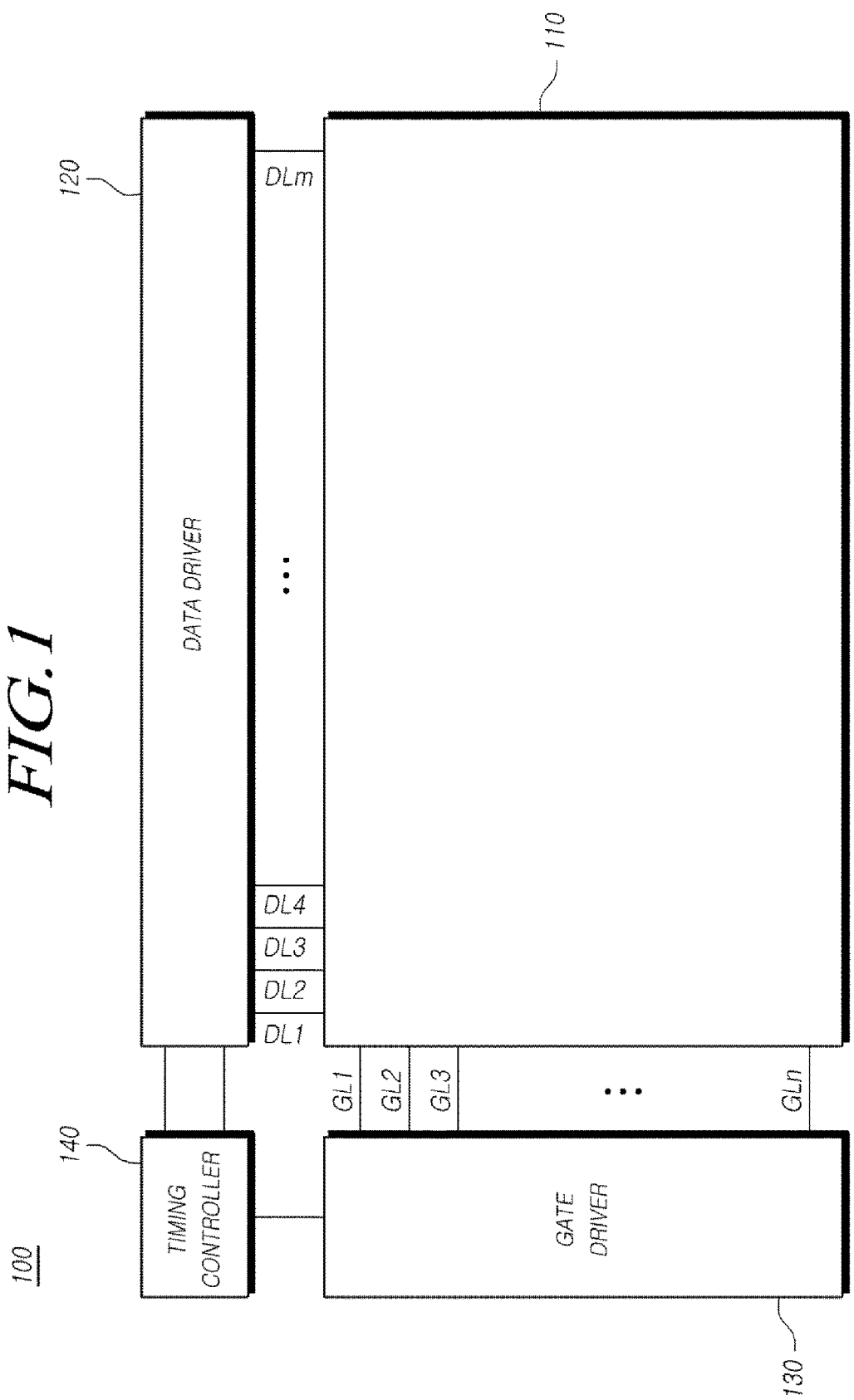
FIG. 1 illustrates a schematic system configuration of a transparent display device according to embodiments of the present invention.

Hereinafter, embodiments of the present invention will be described with reference to the accompanying drawings. In designating elements of the drawings by reference numerals, the same elements will be designated by the same reference numerals although they are shown in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 illustrates a schematic system configuration of a transparent display device 100 according to embodiments. All the components of the transparent display device according to all the embodiments of the present invention are operatively coupled and configured.

Referring to FIG. 1, the transparent display device 100 according to embodiments of the present invention includes a transparent display panel 110 in which a plurality of data lines DL1 to DLm and a plurality of gate lines GL1 to GLn are arranged and a plurality of sub-pixels are arranged, a data driver 120 for driving the plurality of data lines DL1 to DLm, a gate driver 130 for driving the plurality of gate lines GL1 to GLn, and a timing controller 140 for controlling the data driver 120 and the gate driver 130, etc. The data driver 120 and the gate driver 130 correspond to drivers for driving the sub-pixels.

The data driver 120 drives the plurality of data lines by supplying a data voltage to the plurality of data lines. The gate driver 130 sequentially drives the plurality of gate lines by sequentially supplying a scan signal to the plurality of gate lines.

The timing controller 140 controls the data driver 120 and the gate driver 130 by supplying various control signals to the data driver 120 and the gate driver 130.

The timing controller 140 as described above starts scanning according to a timing implemented in each frame, converts image data input from the outside in accordance with a data signal form used by the data driver 120, outputs the converted image data, and controls a data driving at a proper time in accordance with the scanning.

The gate driver 130 sequentially drives the plurality of gate lines by sequentially supplying scan signals of an ON voltage or an OFF voltage to the plurality of gate lines under the control of the timing controller 140.

The gate driver 130 may be located either at only one side of the transparent display panel 110 as shown in FIG. 1 or at both sides thereof in some cases according to the driving scheme or transparent display panel design scheme.

Further, the gate driver 130 may include at least one gate driver integrated circuit.

The plurality of gate driver integrated circuits may be connected to a bonding pad of the transparent display panel 110 through a Tape Automated Bonding (TAB) method or a Chip On Glass (COG) method, or implemented in a Gate In Panel (GIP) type and directly formed in the transparent display panel 110. In some cases, the plurality of gate driver integrated circuits may be integrated and formed in the transparent display panel 110.

Each of the gate driver integrated circuits may be implemented according to a Chip On Film (COF) scheme. In this case, a gate driving chip corresponding to each gate driver integrated circuit may be packaged in a flexible film and one end of the flexible film may be bonded to the transparent display panel 110.

When a particular gate line is open, the data driver 120 converts digital type data, which has been received from the timing controller 140, to an analog type data voltage and supplies the converted data voltage to the plurality of data lines, thereby driving the plurality of data lines.

The data driver 120 includes at least one source driver integrated circuit and thus can drive the plurality of data lines.

Each source driver integrated circuit may be either connected to a bonding pad of the transparent display panel 110 according to a Tape Automatic Bonding (TAB) scheme or a Chip On Glass (COG) scheme or directly placed on the transparent display panel 110. In some cases, each source driver integrated circuit may be integrated and placed in the transparent display panel 110.

Further, each source driver integrated circuit may be implemented according to a Chip On Film (COF) scheme. In this implementation, a source driving chip corresponding to each source driver integrated circuit is packaged in a flexible film, and one end of the flexible film is bonded to at least one source printed circuit board while the other end thereof is bonded to the transparent display panel 110.

The source printed circuit board is connected with a control printed circuit board through a connecting medium, such as a Flexible Flat Cable (FFC) or a Flexible Printed Circuit (FPC).

The timing controller 140 is disposed on the control printed circuit board.

On the control printed circuit board, a power controller may be further disposed for supplying various voltages or currents to the transparent display panel 110, the data driver 120, and the gate driver 130 or controlling various voltages or currents to be supplied thereto.

The source printed circuit board and the control printed circuit board as described above may be included in one integrated printed circuit board.

The transparent display device 100 according to the present embodiments may be a liquid crystal display device or an organic light emitting display device. For convenience of description, the following description is based on an assumption that the transparent display device 100 is an organic light emitting display device.

Meanwhile, the transparent display panel 110 may include a transparent area having a plurality of transparent parts and an opaque area which is not transparent.

In the transparent area, a plurality of transparent parts is arranged in the form of a matrix.

Here, in regard to the arrangement of the multiple transparent parts in the form of a matrix, a plurality of transparent parts in the same row is called one transparent part row and a plurality of transparent parts in the same column is called one transparent part column.

The opaque area includes a light-emitting area, which emits light, and a non-light-emitting area, which does not emit light.

The non-light-emitting area may include a Column Line Area (CLA) in which column lines are arranged.

The column line area corresponds to an inter-transparent part column area. In other words, the column line may be disposed between each of transparent part columns.

The column lines include data lines and various voltage lines arranged in the direction of column.

A light-emitting part of each sub-pixel may be located in the light-emitting area.

Each sub-pixel may be, for example, a red sub-pixel which emits red light, a green sub-pixel which emits green light, a blue sub-pixel which emits blue light, or a sub-pixel which emits light of another color (e.g., white, yellow, etc.) other than red, green, and blue.

Each sub-pixel includes a light-emitting part, which emits light of a corresponding color, and a circuit part in which circuit elements, such as a transistor, are arranged to enable the light-emitting part to emit the light.

For example, when the transparent display panel 110 according to the present embodiments includes sub-pixels having three types of colors (including a first color, a second color, and a third color), a sub-pixel of the first color may include a first color light-emitting part and a first color circuit part, a sub-pixel of the second color may include a second color light-emitting part and a second color circuit part, and a sub-pixel of the third color may include a third color light-emitting part and a third color circuit part.

As another example, when the transparent display panel 110 according to the present embodiments includes sub-pixels having four types of colors (including a first color, a second color, a third color, and a fourth color), a sub-pixel of the first color may include a first color light-emitting part and a first color circuit part, a sub-pixel of the second color may include a second color light-emitting part and a second color circuit part, a sub-pixel of the third color may include a third color light-emitting part and a third color circuit part, and a sub-pixel of the fourth color may include a fourth color light-emitting part and a fourth color circuit part.

The light-emitting part of each sub-pixel may refer to an area which emits light of a corresponding color in each pixel, a pixel electrode (e.g., anode) existing in each sub-pixel, or an area in which the pixel electrode is disposed.

The circuit part of each sub-pixel may refer to a circuit including a transistor, which supplies voltage or current to a pixel electrode of each sub-pixel to enable the light-emitting part to emit light, or an area in which such a circuit is disposed.

In the transparent display panel 110 according to the present embodiments, a light-emitting part of a sub-pixel of at least one color among sub-pixels of various colors (e.g., red, green, blue, etc.) may be located in a column line area.

For example, when sub-pixels of three colors are arranged in the transparent display panel 110 according to the present embodiments, at least one among a first color light-emitting part, a second color light-emitting part, and a third color light-emitting part may be located in the column line area or may overlap the column line area.

The light-emitting part of at least one color, which is located in the column line area or overlaps the column line area as described above, may increase the viewing angle, light-emitting area, and penetration area.

Meanwhile, in the transparent display panel 110 according to the present embodiments, a plurality of sub-pixels may be arranged in an RGB structure or in a structure (hereinafter, referred to as a "2P-4SP" structure in which two pixels are configured by four sub-pixels).

When a plurality of sub-pixels is arranged in a 2P-4SP structure in the transparent display panel 110 according to present embodiments, a smaller number of sub-pixels can similarly express the same resolution than in the case of the RGB structure. Especially, the 2P-4SP structure can improve the transparency of the transparent display panel 110 by reducing the number of sub-pixels.

When a plurality of sub-pixels is arranged in a 2P-4SP structure in the transparent display panel 110 according to present embodiments, a sub-pixel rendering technique may be used.

The 2P-4SP structure applied to the transparent display panel 110 according to present embodiments may include, for example, an RG-BG structure, RG-BW structure, etc. However, for the convenience of description, the following description is based on an example of an RG-BG structure which requires sub-pixels of three colors.

The following description discusses, as a first embodiment, a transparent display panel 110 and a transparent display device 100 including the same, in which a plurality of sub-pixels is arranged in an RGB structure, and discusses, as second and third embodiments, a transparent display panel 110 and a transparent display device 100 including the same, in which a plurality of sub-pixels is arranged in an RG-BG structure and a light-emitting part of a sub-pixel of at least one color is located in or overlaps a column line area.

Figure 2:
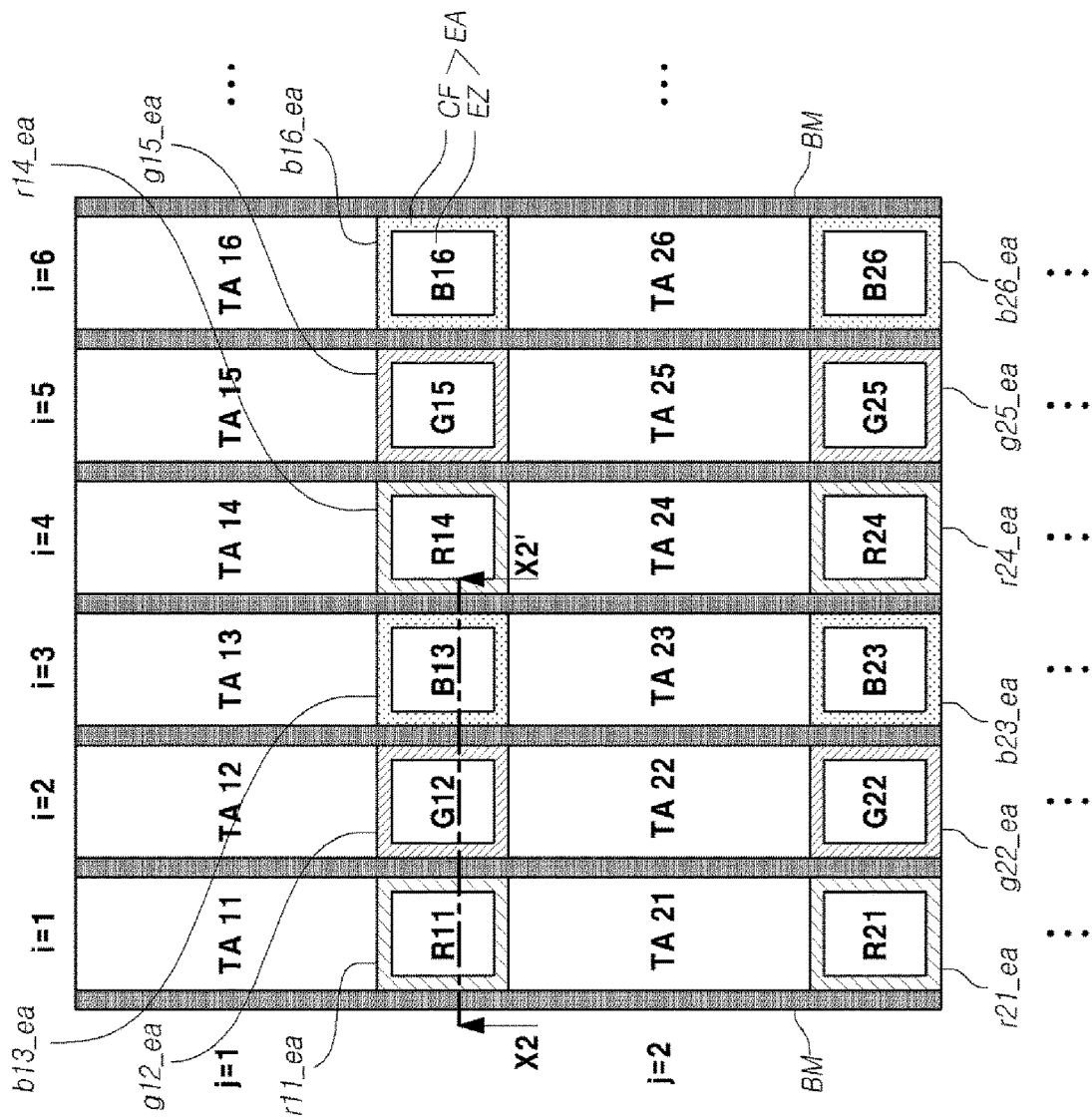
FIG. 2 is a plan view of a transparent display device according to a first embodiment of the present invention.

FIG. 2 is a plan view illustrating a transparent display panel 110 according to a first embodiment.

Referring to FIG. 2, the transparent display panel 110 according to the first embodiment includes a plurality of transparent parts (TA ji wherein j indicates a row number (=1, 2, . . . ) and i indicates a column number (=1, 2, 3, . . . )) in a matrix form.

The transparent display panel 110 according to the first embodiment includes a sub-pixel row arranged between each of transparent part columns.

For example, an RGB sub-pixel row (R11, G12, B13, R14, G15, B16, . . . ) is disposed between the first transparent part row (TA 11, TA 12, TA 13, TA 14, TA 15, TA 16, . . . ) and the second transparent part row (TA 21, TA 22, TA 23, TA 24, TA 25, TA 26, . . . ).

In the same way, an RGB sub-pixel row (R21, G22, B23, R24, G25, B26, . . . ) is disposed between the second transparent part row (TA 21, TA 22, TA 23, TA 24, TA 25, TA 26, . . . ) and the third transparent part row.

In the transparent display panel 110 according to the first embodiment, each sub-pixel includes a light-emitting part and a circuit part which is located under the light-emitting part. As a result, the size of the sub-pixel area may be reduced.

Referring to FIG. 2, a light-emitting part of each sub-pixel is located between each of transparent part rows.

For example, light-emitting parts (r11_ea, g12_ea, b13_ea, r14_ea, g15_ea, b16_ea, of sub-pixels (R11, G12, B13, R14, G15, B16, . . . ) are arranged between the first transparent part row (TA 11, TA 12, TA 13, TA 14, TA 15, TA 16, . . . ) and the second transparent part row (TA 2i wherein i=1, 2, 3, respectively.

In the same way, light-emitting parts (r21_ea, g22_ea, b23_ea, r24_ea, g25_ea, b26_ea, of sub-pixels (R21, G22, B23, R24, G25, B26, are arranged between the second transparent part row (TA 21, TA 22, TA 23, TA 24, TA 25, TA 26, . . . ) and the third transparent part row.

Since a circuit part is located under a light-emitting part in each sub-pixel, areas of light-emitting parts (r11_ea, g12_ea, b13_ea, r14_ea, g15_ea, b16_ea, r21_ea, g22_ea, b23_ea, r24_ea, g25_ea, b26_ea, . . . ) of sub-pixels are identical to the areas of the sub-pixels, respectively.

Each of the areas of light-emitting parts (r11_ea, g12_ea, b13_ea, r14_ea, g15_ea, b16_ea, . . . , r21_ea, g22_ea, b23_ea, r24_ea, g25_ea, b26_ea, . . . ) of the sub-pixels includes a light-emitting zone (EZ) and the other zone (CF).

In the following description, a light-emitting area, viewing angle, and transparent area of the transparent display panel 110 according to the first embodiment will be discussed through a sectional view taken along line X2-X2'. The light-emitting area, viewing angle, and transparent area are important factors having a large influence on the performance of the transparent display panel 110.

Figure 3:
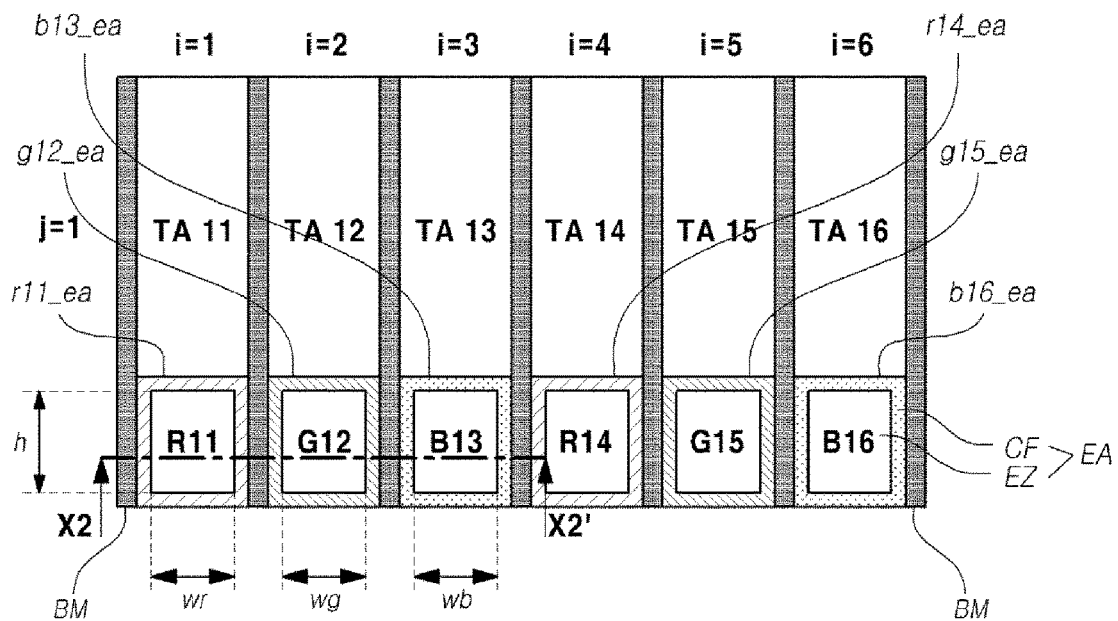
FIGS. 3 and 4 are views for describing the light-emitting areas, viewing angles, and transparent areas of the areas in which the first, second, and third light-emitting parts are located in the transparent display panel according to the first embodiment, and a sectional view thereof.
Figure 3:
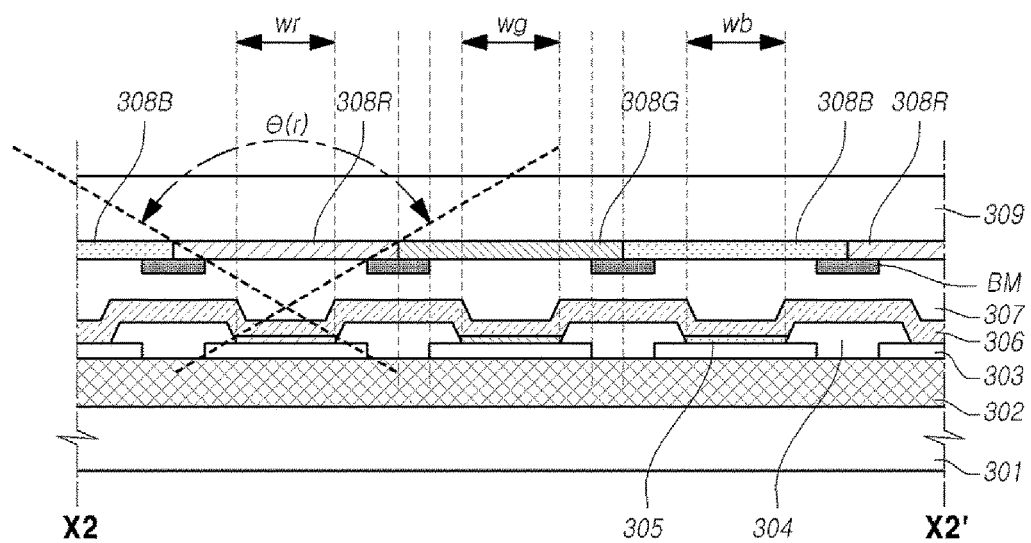
Figure 4:
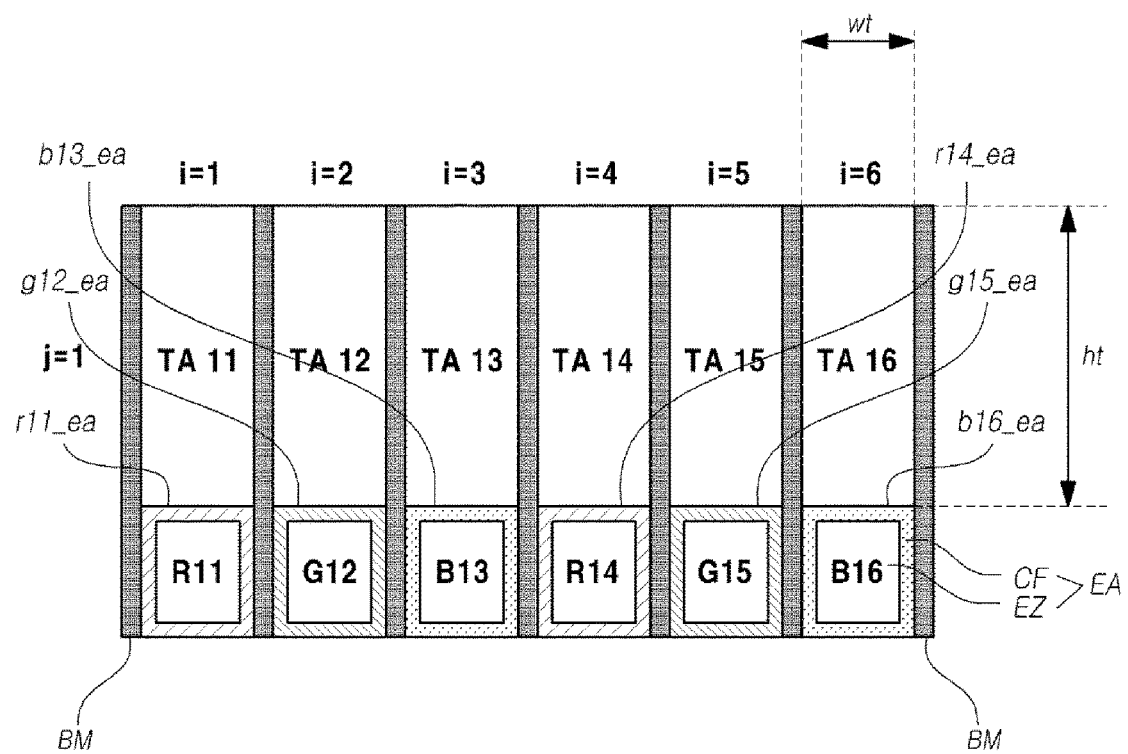

FIGS. 3 and 4 are views for describing the light-emitting areas, viewing angles, and transparent areas of the areas in which the first, second, and third light-emitting parts (r11_ea, g12_ea, and b13_ea) are located in the transparent display panel 110 according to the first embodiment, and a sectional view (taken along line X2-X2' in FIG. 2) thereof.

Referring to FIG. 3, the light-emitting area of a light-emitting part of each sub-pixel in the transparent display panel 110 according to the first embodiment may be determined by the area of the light-emitting zone (EZ) within the light-emitting part.

The light-emitting area of the first color light-emitting part (r11_ea) corresponds to wr*h, the light-emitting area of the second color light-emitting part (g12_ea) corresponds to wg*h, and the light-emitting area of the third color light-emitting part (b13_ea) corresponds to wb*h. For convenience of description, it is assumed that the widths of the respective light-emitting zones (EZ) of the first color light-emitting part (r11_ea), the second color light-emitting part (g12_ea), and the third color light-emitting part (b13_ea) in the direction of column are identical and have a value of h.

Referring to the sectional view (X2-X2') in FIG. 3, a circuit layer 302 in which a circuit part having circuit elements, such as a transistor (TFT), in each sub-pixel, is formed is located on a first substrate 301, and a first electrode 303 is disposed thereon and is connected to a source or drain of each sub-pixel. The first electrode 303 may be, for example, an anode or a cathode of an organic light-emitting diode.

A bank 304 is disposed at a boundary part of each sub-pixel. An organic layer 305 of each sub-pixel is located between each of banks 304.

A second electrode 306 is formed on the entire surface of the organic layer 305. The second electrode 306 is an electrode corresponding to the first electrode 303 and may be an anode or a cathode of an organic light-emitting diode.

An encapsulation layer and an adhesive layer 307 may be disposed on the second electrode 306.

At the boundary part of each sub-pixel, a black matrix (BM) is disposed on the adhesive layer 307. In the light-emitting part of the sub-pixel, a color filter 308R, 308G, 308B, . . . of a corresponding color may be located, and a second substrate 309 is disposed thereon.

Referring to FIG. 3, the row-directional widths (wr, wg, and wb) of light-emitting zones (EZ) of the light-emitting parts (r11_ea, g12_ea, and b13_ea) of the sub-pixels are identical to the widths (wr, wg, and wb) occupied by the first electrodes 303 of the sub-pixels, respectively.

Referring to FIG. 3, in the transparent display panel 110 according to the first embodiment, since the light-emitting part and the circuit part are located above and below in each sub-pixel (in other words one above the other in each sub-pixel), the light-emitting part may have a larger area than in the case where the light-emitting part of each sub-pixel is located at a lateral side of the circuit part thereof. That is, the transparent display panel 110 according to the first embodiment is advantageous in that it has a large light-emitting area in view of the arrangement of the light-emitting part and the circuit part.

Nevertheless, the structure of the transparent display panel 110 according to the first embodiment has a limit in the row-directional width (wr, wg, or wb) of the light-emitting zone (EZ) of the light-emitting part of each sub-pixel thereof, since the light-emitting parts (r11_ez, g12_ez, and b13_ez) of the sub-pixels of all colors are arranged in the same row line and a structure, such as the bank 304, is located between each of sub-pixel columns (i.e. transparent part columns), that is, in every sub-pixel boundary area. As a result, it is impossible to increase the light-emitting area of the transparent display panel 110 according to the first embodiment any more.

Further, the row-directional width (wr, wg, or wb) of the light-emitting zone (EZ) of the light-emitting part of each sub-pixel is limited and the emitted light is blocked by a black matrix (BM), which resultantly limits the viewing angle ($\theta(r)$).

According to the above description, the transparent display panel 110 according to the first embodiment has a limited light-emitting area and limited viewing angle due to the structure in which the light-emitting parts (r11_ez, g12_ez, and b13_ez) of the sub-pixels of all colors are arranged in the same row line (row line between transparent part rows).

Further, referring to FIG. 4, a plurality of transparent parts TA11, TA12, TA13, TA14, TA15, TA16, . . . included in one transparent part row have the same row-directional width (wt) and the same column-directional width (ht).

As shown in FIG. 4, due to the structure in which the light-emitting parts (r11_ez, g12_ez, and b13_ez) of the sub-pixels of all colors are arranged in the same row line (row line between transparent part rows), the black matrixes (BM) cannot help being displayed at narrower intervals between each of the plurality of transparent parts TA11, TA12, TA13, TA14, TA15, TA16, . . . included in one transparent part row.

Therefore, in the transparent display panel 110 according to the first embodiment, the row-directional width (wt) of each of the transparent parts TA11, TA12, TA13, TA14, TA15, TA16, . . . included in one transparent part row is inevitably limited. As a result, the transparent display panel 110 according to the first embodiment may have a low transparency.

As described above with reference to FIGS. 2 to 4, the transparent display panel 110 according to the first embodiment has structural shortcomings in that it has a small light-emitting area, narrow viewing angle, and low transparency.

Hereinafter, a transparent display panel 110 according to the second or third embodiment, which has a structure capable of achieving a wider light-emitting area, wider viewing angle, and better transparency, will be described. The following description is based on an assumption that the first color is green, the second color is red, and the third color is blue.

Figure 5:
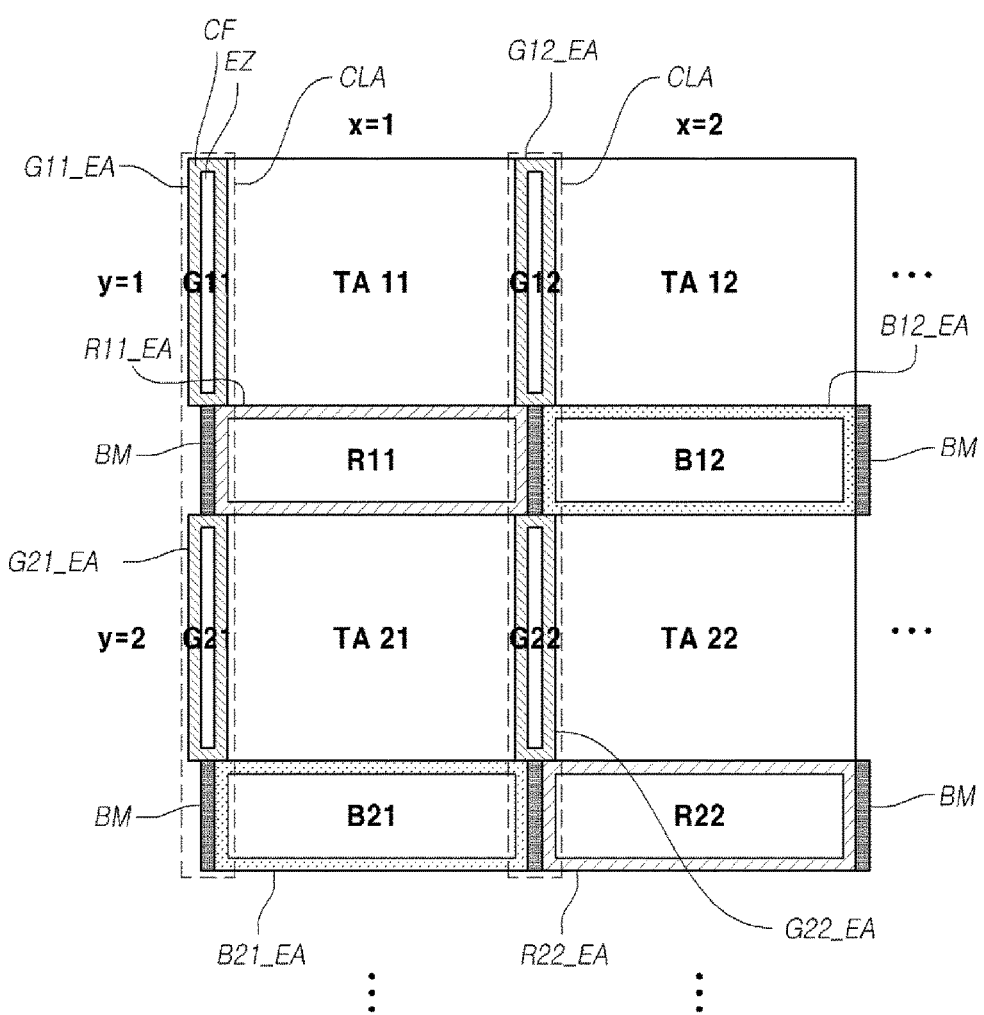
FIG. 5 is a plan view of the transparent display panel according to a second embodiment of the present invention.
Figure 6:
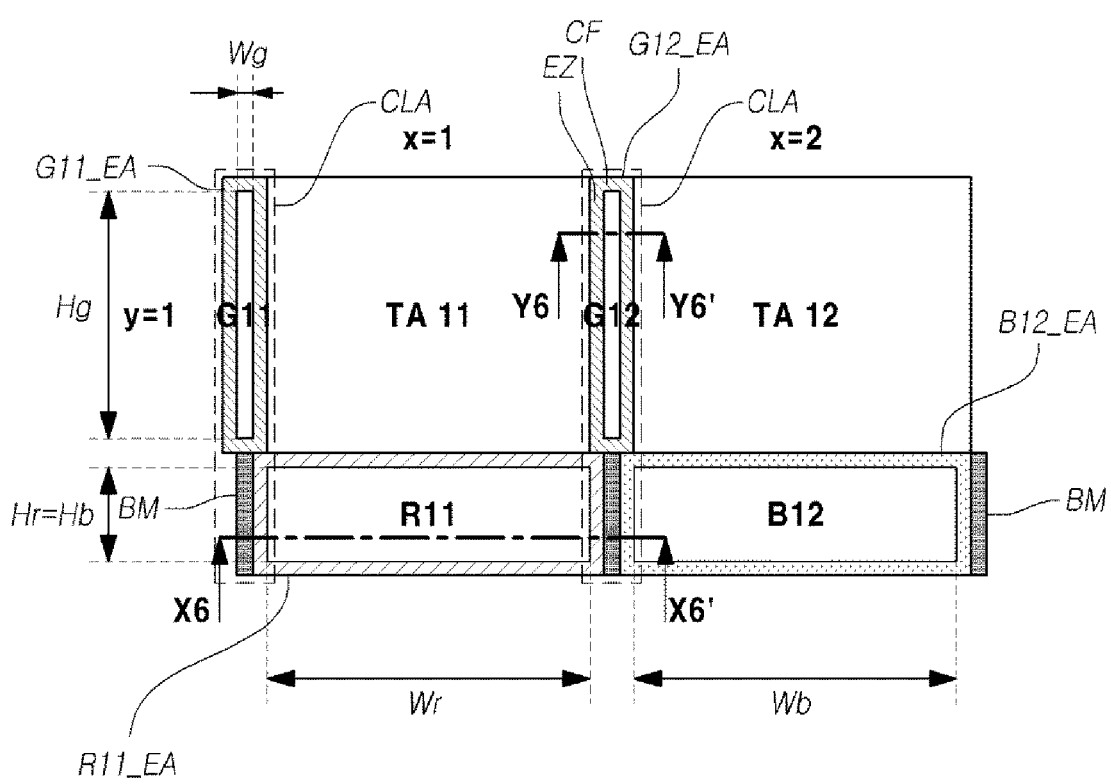
FIG. 6 is a view for describing an arrangement structure of light-emitting parts according to colors and light-emitting areas of the light-emitting parts according to colors in the transparent display panel according to the second embodiment.

FIG. 5 is a plan view of the transparent display panel 110 according to the second embodiment. FIG. 6 is a view for describing an arrangement structure of light-emitting parts according to colors and light-emitting areas of the light-emitting parts according to colors in the transparent display panel 110 according to the second embodiment.

Referring to FIG. 5, the transparent display panel 110 according to the second embodiment includes a plurality of transparent parts (TA yx wherein y indicates a row number (=1, 2, . . . ) and x indicates a column number (=1, 2, 3, . . . )) arranged in a matrix form.

Referring to FIG. 5, the transparent display panel 110 according to the second embodiment has, for example, an RG-BG structure.

Referring to FIG. 5, in the transparent display panel 110 according to the second embodiment, first color light-emitting parts G11_EA, G12_EA, G21_EA, and G22_EA of first color sub-pixels G11, G12, G21, and G22 are located on column lines arranged in a column line area (CLA) corresponding to an area between transparent part columns.

In the transparent display panel 110 according to the second embodiment, second color light-emitting parts R11_EA and R22_EA of second color sub-pixels R11 and R22 and third color light-emitting parts B12_EA and B21_EA of third color sub-pixels B12 and B21 are located between each of transparent part rows.

Meanwhile, the first color light-emitting parts G11_EA, G12_EA, G21_EA, and G22_EA are located in the column line area (CLA) while being perpendicular to the second color light-emitting parts R11_EA and R22_EA and being perpendicular to the third color light-emitting parts B12_EA and B21_EA.

As described above, the transparent display panel 110 according to the second embodiment does not have a structure in which all of the first color light-emitting parts G11_EA, G12_EA, G21_EA, and G22_EA, the second color light-emitting parts R11_EA and R22_EA, and the third color light-emitting parts B12_EA and B21_EA are arranged between transparent part rows, but has a structure in which the first color light-emitting parts G11_EA, G12_EA, G21_EA, and G22_EA of the first color sub-pixels G11, G12, G21, and G22 are located in the column line area. Therefore, the second color light-emitting parts R11_EA and R22_EA and the third color light-emitting parts B12_EA and B21_EA can be arranged more widely in areas between the transparent part rows.

Therefore, the transparent display panel 110 according to the second embodiment can have a wider light-emitting area for the second color and the third color than the transparent display panel 110 according to the first embodiment having the same panel size.

Now, the light-emitting areas of the second color light-emitting parts R11_EA and R22_EA and the third color light-emitting parts B12_EA and B21_EA will be described in more detail. The light-emitting area of the second color light-emitting parts R11_EA and R22_EA corresponds to a product of a row-directional width (Wr) and a column-directional width (Hr) of the light-emitting zone (EZ) and the light-emitting area of the third color light-emitting parts B12_EA and B21_EA corresponds to a product of a row-directional width (Wb) and a column-directional width (Hb) of the light-emitting zone (EZ).

As described above, in the transparent display panel 110 according to the second embodiment, the first color light-emitting parts G11_EA, G12_EA, G21_EA, and G22_EA of the first color sub-pixels G11, G12, G21, and G22 are located in the column line area (CLA). Therefore, the light-emitting zones (EZ) of the second color light-emitting parts R11_EA and R22_EA and the third color light-emitting parts B12_EA and B21_EA located in the areas between transparent part rows may have wider row-directional widths (Wr and Wb).

As a result, the transparent display panel 110 according to the second embodiment can have a wider light-emitting area for the second color and the third color than the transparent display panel 110 according to the first embodiment having the same panel size.

Meanwhile, referring to FIG. 6, the first color light-emitting parts G11_EA, G12_EA, G21_EA, and G22_EA, which are located on the column lines in the column line area (CLA), are lengthily extended in the column line area (CLA) between transparent part columns.

As a result, the first color light-emitting parts G11_EA, G12_EA, G21_EA, and G22_EA, which are located on the column lines in the column line area (CLA), have the smallest light-emitting areas, respectively.

Each of the light-emitting areas of the first color light-emitting parts G11_EA, G12_EA, G21_EA, and G22_EA is determined as a product of a row-directional width (Wg) and a column-directional width (Hg) of the light-emitting zone (EZ).

Meanwhile, since the first color light-emitting parts G11_EA, G12_EA, G21_EA, and G22_EA are lengthily located in the column line area (CLA) between transparent part columns, they can provide a space capable of widening the row-directional widths (Wr and Wb) of the light-emitting zones (EZ) of the second color light-emitting parts R11_EA and R22_EA and the third color light-emitting parts B12_EA and B21_EA and a space capable of increasing the transparent area of the transparent part.

The first color light-emitting parts G11_EA, G12_EA, G21_EA, and G22_EA have a smaller light-emitting area than the second color light-emitting parts R11_EA and R22_EA and the third color light-emitting parts B12_EA and B21_EA. However, the light-emitting zone (EZ) of the first color light-emitting parts has a considerably large column-directional width (Hg). As a result, the entire light-emitting area of the transparent display panel 110 according to the second embodiment is not much smaller than the light-emitting area of the transparent display panel 110 according to the first embodiment.

Therefore, the transparent display panel 110 according to the second embodiment can have a wider light-emitting area for the second color and the third color while having a similar or slightly increased light-emitting area for the first color, in comparison with the transparent display panel 110 according to the first embodiment having the same panel size.

Figure 7:
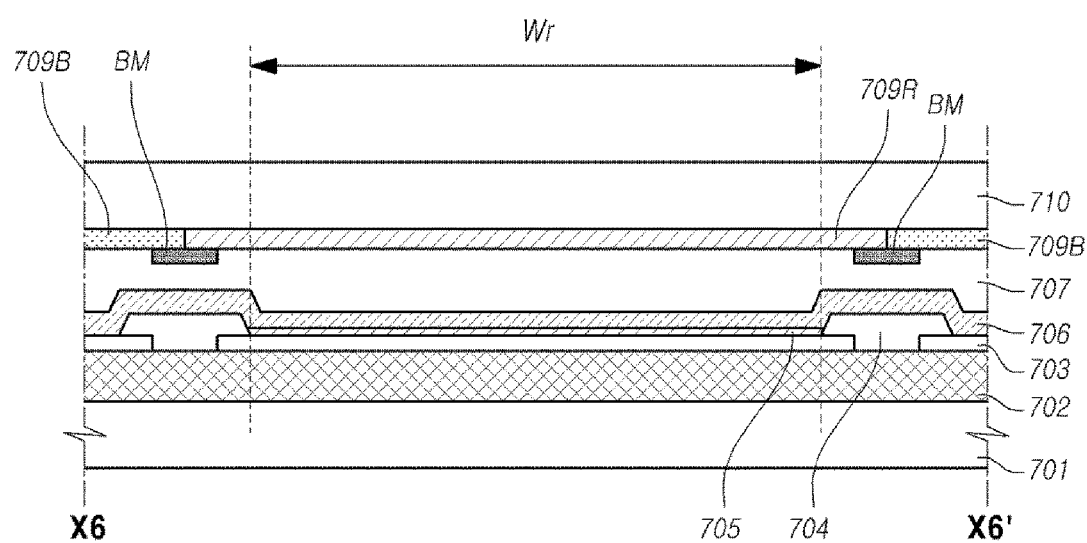
FIG. 7 is a sectional view of an area in which second color light-emitting parts are located in the transparent display panel according to the second embodiment.

FIG. 7 is a sectional view (taken along line X6-X6' in FIG. 6) of an area in which the second color light-emitting part R11_EA is located, in the transparent display panel 110 according to the second embodiment.

In view of the area in which the second color light-emitting part R11_EA is located, with reference to FIG. 7, a first substrate 701 is located lowermost.

A circuit layer 702 in which a circuit part having various circuit elements, such as a transistor (TFT), for each sub-pixel is formed is disposed on the first substrate 701.

A first electrode 703 is disposed on the circuit layer 702 and is connected to a source or drain of the transistor formed for each sub-pixel in the circuit layer 702. The first electrode 703 may be, for example, an anode or a cathode of an organic light-emitting diode.

A bank 704 is disposed at a boundary part of each sub-pixel and an organic layer 705 of each sub-pixel is located between each of banks 704.

A second electrode 706 is formed on the entire surface of the organic layer 705.

The second electrode 706 is an electrode corresponding to the first electrode 703 and may be an anode or a cathode of an organic light-emitting diode.

An encapsulation layer and an adhesive layer 707 may be disposed on the second electrode 706.

At the boundary are of the second color sub-pixel R11 and the third color sub-pixel B12, a black matrix (BM) is disposed on the adhesive layer 707. A second color filter 709R is disposed thereof as much as the width of the second color sub-pixel R11, and a second substrate 710 is then disposed thereon. The second color filter 709R is located between third color filters 709B.

Although FIG. 7 shows a sectional view of an area in which only one second color light-emitting part R11_EA is located, the transparent display panel 110 according to the second embodiment may have the same section in other areas in which the third color light-emitting parts B12_EA, B21_EA, . . . are located as well as the areas in which the other second color light-emitting parts R22_EA, . . . are located.

Figure 8:
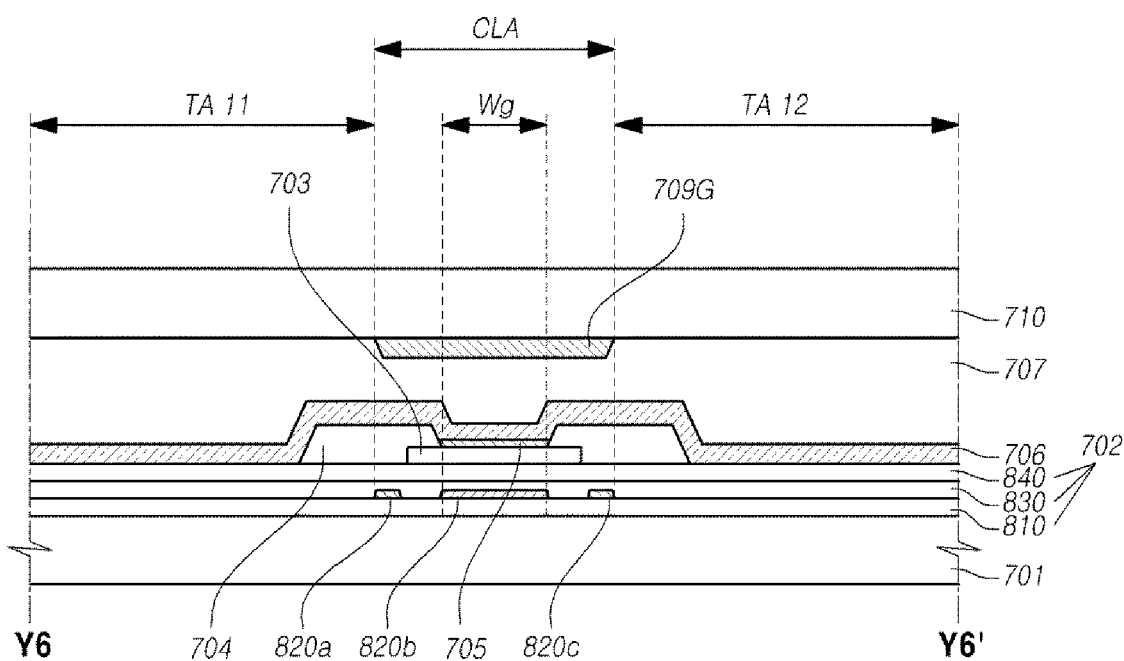
FIG. 8 is a sectional view of an area in which first color light-emitting parts are located in the transparent display panel according to the second embodiment.

FIG. 8 is a sectional view (taken along line Y6-Y6' in FIG. 6) of an area in which the first color light-emitting part G12_EA is located, in the transparent display panel 110 according to the second embodiment.

In view of the area in which the first color light-emitting part G12_EA is located, with reference to FIG. 8, a first substrate 701 is located lowermost.

A circuit layer 702 in which a circuit part having various circuit elements, such as a transistor (TFT), for each sub-pixel is formed is disposed on the first substrate 701.

The circuit layer 702 as described above may include an inter-layer film 810, column lines 820a, 820b, and 820c located in a part corresponding to a column line area (CLA) on the inter-layer film 810, a flattening layer 830 covering the inter-layer film 810 and the column lines 820a, 820b, and 820c located thereon, and a protective layer 840 located on the flattening layer 830.

Among the column lines 820a, 820b, and 820c corresponding to the column line area (CLA), the centrally-located column line 820b may be a driving voltage line (DVL) for supplying a driving voltage (VDD) or a base voltage line (GVL) for supplying a base voltage (VSS) and two column lines 820a and 820c disposed at opposite sides thereof may be two data lines.

The first electrode 703 is disposed on the circuit layer 702 and is connected to a source or drain of the transistor formed for each sub-pixel in the circuit layer 702. The first electrode 703 may be, for example, an anode or a cathode of an organic light-emitting diode.

A bank 704 is disposed at a boundary part of each sub-pixel and an organic layer 705 of each sub-pixel is located between each of banks 704.

A second electrode 706 is formed on the entire surface of the organic layer 705 formed at each sub-pixel. The second electrode 706 is an electrode corresponding to the first electrode 703 and may be an anode or a cathode of an organic light-emitting diode.

An encapsulation layer (not shown) and an adhesive layer 707 may be disposed on the second electrode 706.

Differently from the second color light-emitting part and the third color light-emitting part, a black matrix (BM) does not exist in the area in which the first color light-emitting part is located.

Therefore, a first color filter 709G may be disposed as much as the row-directional width of the column line area (CLA) on the adhesive layer 707, and a second substrate 710 is disposed thereon.

Beside the first color filter 709G, another color filter does not exist but only the transparent parts TA11 and TA12 exist. The layers 701, 702, 706, 707, and 710 stacked in the section of the area in which the transparent parts TA 11 and TA 12 are formed of a transparent material.

As a result, the first color light-emitting part G12_EA has a nearly limitless viewing angle.

Although FIG. 8 shows a sectional view of an area in which only one first color light-emitting part G12_EA is located, the transparent display panel 110 according to the second embodiment may have the same section in other first color light-emitting parts (G11_EA, G21_EA, G22_EA, . . . ).

Figure 9:
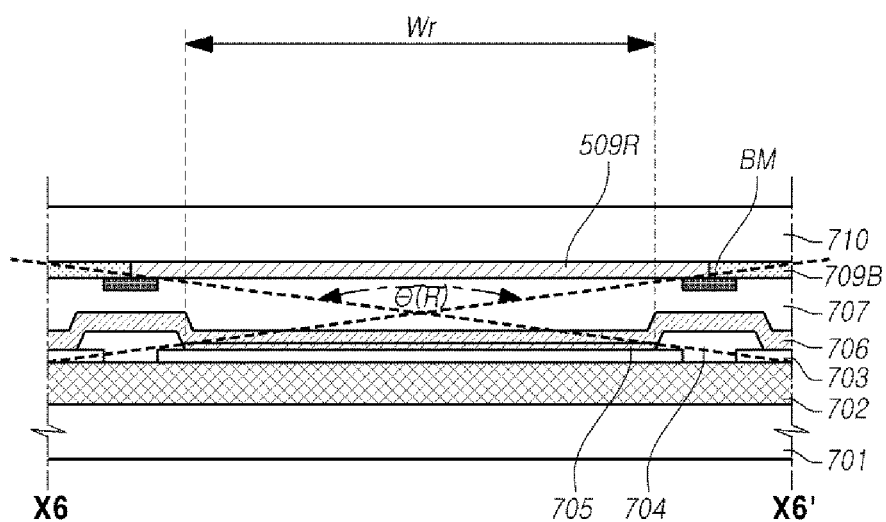
FIG. 9 is a view for describing the viewing angle of the transparent display panel according to the second embodiment.
Figure 9:
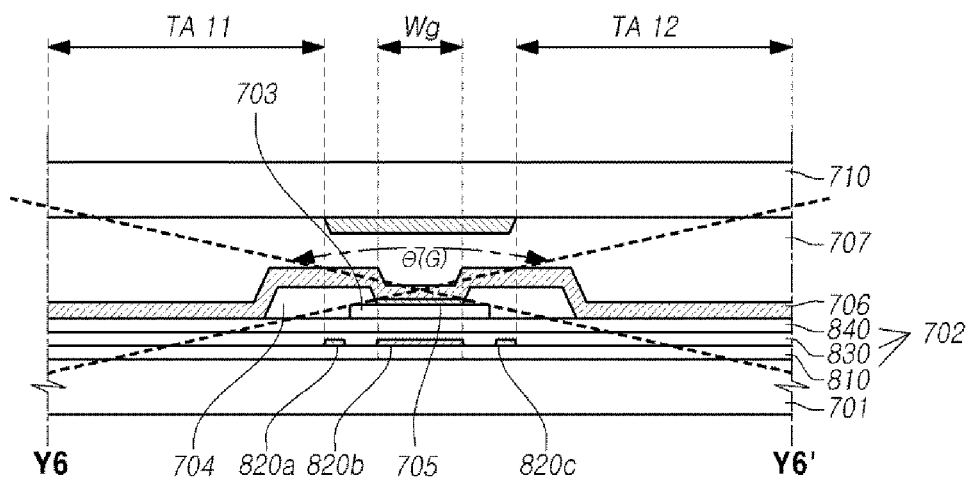

FIG. 9 is a view for describing the viewing angle of the transparent display panel 110 according to the second embodiment.

Referring to FIGS. 9 and 5, black matrixes (BM) are arranged between the second color light-emitting parts R11_EA and R22_EA and the third color light-emitting parts B12_EA and B21_EA. However, black matrixes (BM) are not arranged at all between the transparent parts TA 11, TA 12, TA 21, and TA 22 adjacent to the first color light-emitting parts G11_EA, G12_EA, G21_EA, and G22_EA.

Accordingly, the first color light-emitting parts G11_EA, G12_EA, G21_EA, and G22_EA have a viewing angle ($\theta(G)$) larger than each of the viewing angles ($\theta(R)$, $\theta(B)$) of the second color light-emitting parts R11_EA and R22_EA and the third color light-emitting parts B12_EA and B21_EA.

As described above, since a black matrix (BM) is not arranged at all around the first color light-emitting parts G11_EA, G12_EA, G21_EA, and G22_EA, the first color light-emitting parts G11_EA, G12_EA, G21_EA, and G22_EA have a wide viewing angle (θ(G)) which approaches nearly 180 degrees.

The second color light-emitting parts R11_EA and R22_EA and the third color light-emitting parts B12_EA and B21_EA have light-emitting areas having larger row-directional widths (Wr and Wb) than those of the transparent display panel 110 according to the first embodiment.

Therefore, viewing angles (θ(R), θ(B)) of second color light-emitting parts R11_EA and R22_EA and the third color light-emitting parts B12_EA and B21_EA are wider than the viewing angles of those of the transparent display panel 110 according to the first embodiment.

As a result, for all color light-emitting parts, the transparent display panel 110 according to the second embodiment can achieve improved viewing angle characteristics in comparison with the transparent display panel 110 according to the first embodiment, even without a design change, such as reduction of a cell gap.

Figure 10:
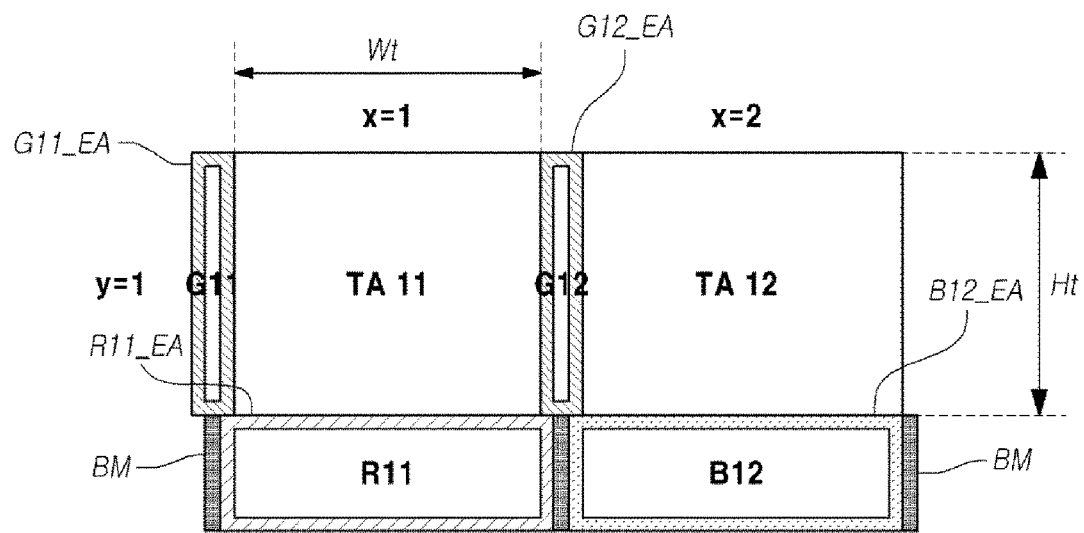
FIG. 10 is a view for describing the transparent area of the transparent display panel according to the second embodiment.

FIG. 10 is a view for describing the transparent area of the transparent display panel 110 according to the second embodiment.

Referring to FIG. 10, a plurality of transparent parts TA11, TA12, TA21, TA22, ... have the same row-directional width (wt) and the same column-directional width (ht).

Referring to FIG. 10, the transparent display panel 110 according to the second embodiment does not have a structure in which all of the first color light-emitting parts G11_EA, G12_EA, G21_EA, and G22_EA, the second color light-emitting parts R11_EA and R22_EA, and the third color light-emitting parts B12_EA and B21_EA are arranged between transparent part rows, but has a structure in which the first color light-emitting parts G11_EA, G12_EA, G21_EA, and G22_EA are located on the column lines disposed in the column line area (CLA) and only the second color light-emitting parts R11_EA and R22_EA and the third color light-emitting parts B12_EA and B21_EA are located between transparent part rows. Therefore, each of the multiple transparent parts TA11, TA12, TA21, TA22, ... may have an increased row-directional width (Wt).

As a result, the transparent display panel 110 according to the second embodiment has a high transparency.

Figure 11:
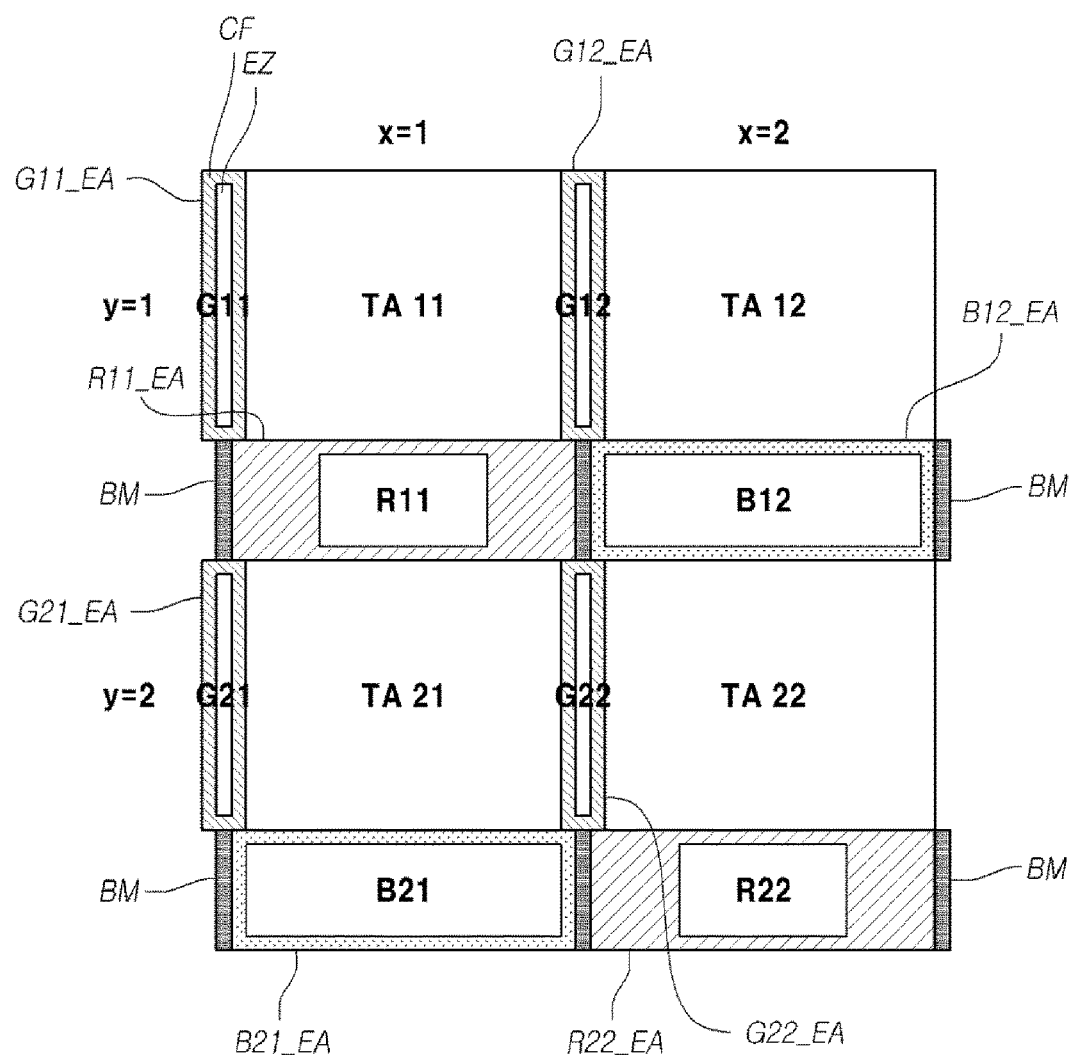
FIG. 11 is another view for describing light-emitting areas of the light-emitting parts according to colors in the transparent display panel according to the second embodiment.

FIG. 11 is another view for describing light-emitting areas of the light-emitting parts according to colors in the transparent display panel 110 according to the second embodiment.

In the transparent display panel 110 according to the second embodiment illustrated in FIGS. 5 to 10, the light-emitting area (Wr*Hr) of the second color light-emitting parts R11_EA and R22_EA and the light-emitting area (Wb*Hb) of the third color light-emitting parts B12_EA and B21_EA are identical or similar to each other.

In contrast, when the second color is red and the third color is blue, the light-emitting area (Wr*Hr) of the second color light-emitting parts R11_EA and R22_EA may be designed to be smaller than the light-emitting area (Wb*Hb) of the third color light-emitting parts B12_EA and B21_EA, as shown in FIG. 11.

In this design, the light-emitting area (Wb*Hb) of the third color light-emitting parts B12_EA and B21_EA is largest, the light-emitting area (Wr*Hr) of the second color light-emitting parts R11_EA and R22_EA is next largest, and the light-emitting area (Wg*Hg) of the first color light-emitting parts G11_EA, G12_EA, G21_EA, and G22_EA is smallest.

Figure 12:
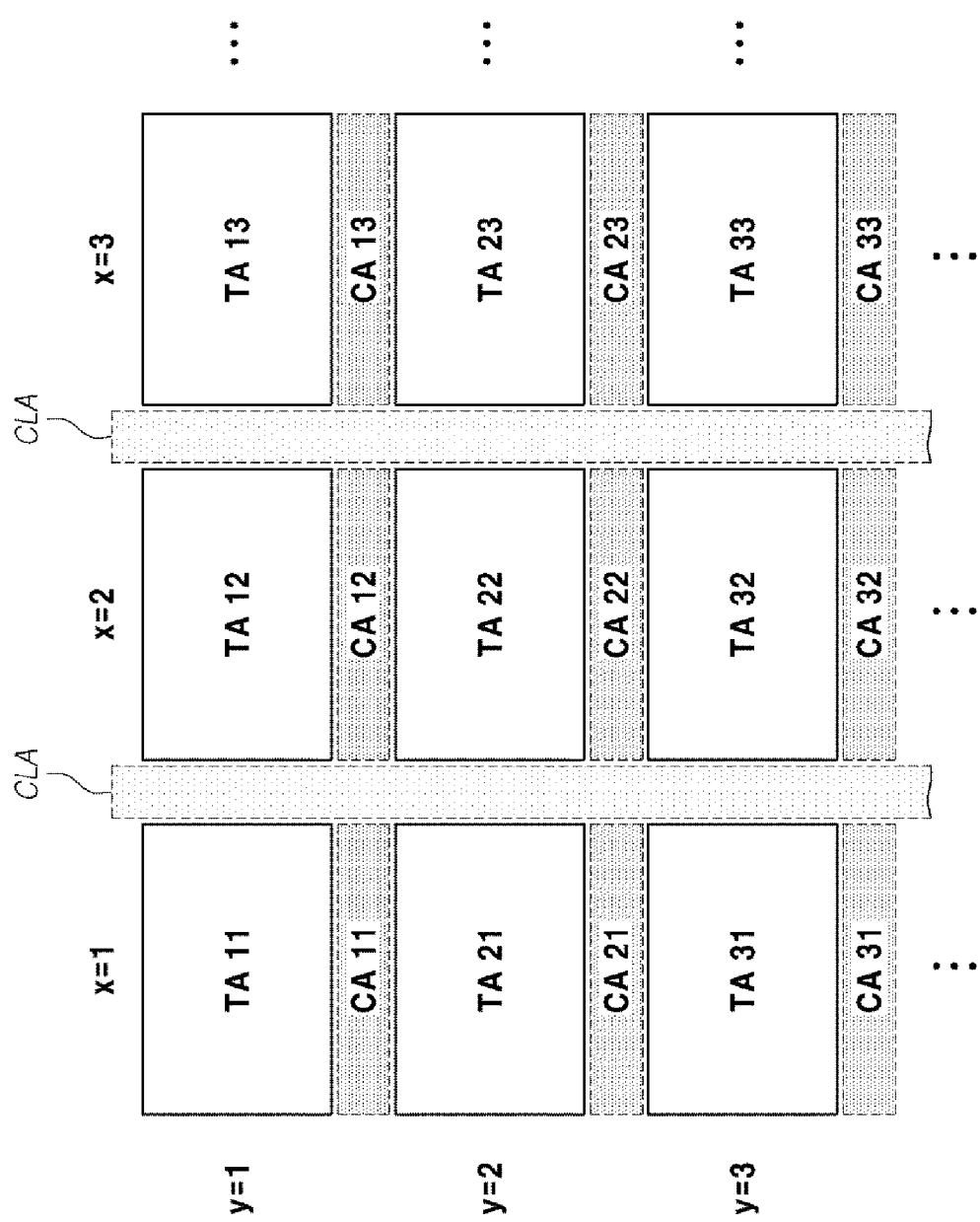
FIG. 12 illustrates column line areas and circuit arrangement areas in the transparent display panel according to the second embodiment.

FIG. 12 illustrates column line areas (CLAs) and circuit arrangement areas (CA 11, CA 12, CA 13, ..., CA 21, CA 22, CA 23, ..., CA 31, CA 32, CA 33, ...) in the transparent display panel 110 according to the second embodiment.

Referring to FIG. 12, as described above, column line areas (CLAs) are located between each of transparent part columns in the transparent display panel 110 according to the second embodiment.

That is, a column line area (CLA) is located between a transparent part column (TA11, TA21, TA31, ...) having a column number (x) of 1 and a transparent part column (TA12, TA22, TA32, ...) having a column number (x) of 2. Further, a column line area (CLA) is located between a transparent part column (TA12, TA22, TA32, ...) having a column number (x) of 2 and a transparent part column (TA13, TA23, TA33, ...) having a column number (x) of 3.

Further, referring to FIG. 12, circuit arrangement areas (CA 11, CA 12, CA 13, ..., CA 21, CA 22, CA 23, ..., CA 31, CA 32, CA 33, ...) in which circuit parts for sub-pixels are arranged are located between each of transparent part rows in the transparent display panel 110 according to the second embodiment.

That is, circuit arrangement areas (CA 11, CA 12, CA 13, ...) in which circuit parts for sub-pixels are arranged are located between a transparent part row (TA11, TA12, TA13, ...) having a row number (y) of 1 and a transparent part row (TA21, TA22, TA23, ...) having a row number (y) of 2.

That is, circuit arrangement areas (CA 21, CA 22, CA 23, ...) in which circuit parts for sub-pixels are arranged are located between a transparent part row (TA21, TA22, TA23, ...) having a row number (y) of 2 and a transparent part row (TA31, TA32, TA33, ...) having a row number (y) of 3.

That is, circuit arrangement areas (CA 31, CA 32, CA 33, ...) in which circuit parts for sub-pixels are arranged are located between a transparent part row (TA31, TA32, TA33, ...) having a row number (y) of 3 and a transparent part row (not shown) having a row number (y) of 4.

Figure 13:
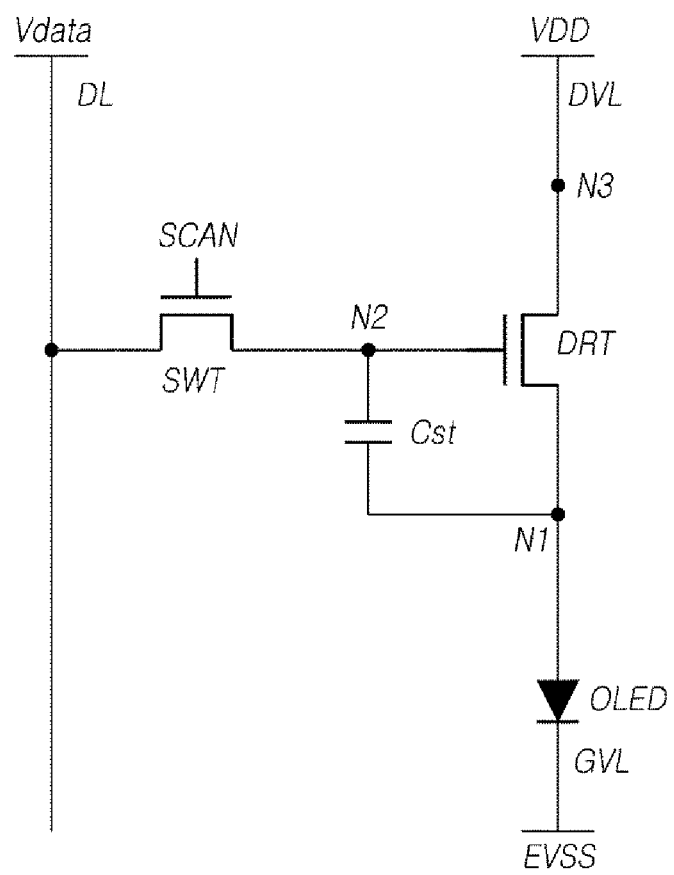
FIG. 13 illustrates a basic circuit configuring a circuit part of a sub-pixel for each color in the transparent display panel according to the second embodiment.

FIG. 13 illustrates a basic circuit configuring a circuit part of a sub-pixel for each color in the transparent display panel 110 according to the second embodiment.

When the transparent display panel 110 according to the second embodiment is an organic light-emitting display panel, FIG. 13 illustrates a basic circuit configuring a circuit part of a sub-pixel for each color.

Referring to FIG. 13, when the transparent display panel 110 according to the second embodiment is an organic light-emitting display panel, a circuit part of a sub-pixel for each color may basically include an Organic Light Emitting Diode (OLED), a driving transistor (DRT) for driving the same, a switching transistor (SWT) for transferring a data voltage (Vdata) to a second node (N2) of the driving transistor (DRT), and a storage capacitor (Cst) for maintaining a predetermined voltage during one frame.

The Organic Light Emitting Diode (OLED) is configured by the first electrode 703, the organic layer 705, and the second electrode 706.

For example, the first electrode 703 of the Organic Light Emitting Diode (OLED) may be an anode while the second electrode 706 thereof may be a cathode.

The first electrode 703 of the Organic Light Emitting Diode (OLED) is electrically connected to the first node (N1) of the driving transistor (DRT). A base voltage (VSS) is supplied through a base voltage line (GVL) to the second electrode 706 of the Organic Light Emitting Diode (OLED).

The driving transistor (DRT) is a transistor for driving the organic light-emitting diode (OLED) and has a first node (N1) corresponding to a source node or drain node, a second node (N2) corresponding to a gate node, and a third node (N3) corresponding to a drain node or source node.

For example, the first node (N1) of the driving transistor (DRT) is electrically connected to the first electrode 703 of the Organic Light Emitting Diode (OLED). For example, the second node (N2) of the driving transistor (DRT) is electrically connected to the source node or drain node of the switching transistor (SWT). For example, the third node (N3) of the driving transistor (DRT) is electrically connected to the driving voltage line (DVL) supplying the driving voltage (VDD).

The switching transistor (SWT) is a transistor for transferring a data voltage (Vdata) to the second node (N2) of the driving transistor (DRT) wherein the drain node or source node is electrically connected to the data line (DL) for supplying the data voltage (Vdata), the source node or drain node is electrically connected to the second node (N2) of the driving transistor (DRT), and the gate node is electrically connected to the gate line to receive a scan signal (SCAN) applied thereto.

The storage capacitor (Cst) is interposed between and connected to the first node (N1) and the second node (N2) of the driving transistor (DRT).

The sub-pixel circuit structure illustrated in FIG. 13 corresponds to a basic structure (2T1C structure) including two transistors (DRT and SWT) and one capacitor (Cst), and may further include one or more transistors or one or more capacitors in some cases.

For example, in order to initialize the voltage of the first node (N1) of the driving transistor (DRT) to a reference voltage (Vref) or enable sensing of the voltage of the first node (N1) of the driving transistor (DRT) to obtain properties (e.g., threshold voltage, movement degree, etc.) of the driving transistor (DRT) or properties (e.g., threshold voltage, degradation degree, etc.) of the organic light-emitting diode (OLED), the structure may further include a sensing transistor connected between the reference voltage line and the first node (N1) of the driving transistor (DRT).

Further, the structure may further include a light-emitting control transistor which is controlled by a light-emitting control signal (EM signal) and is electrically connected between the driving voltage line (DVL) and the third node (N3) of the driving transistor (DRT).

Further, the structure may further include a capacitor electrically connected between the first node (N1) of the driving transistor (DRT) and a point at which the light-emitting control transistor and the driving voltage line (DVL) are electrically connected to each other.

Figure 14:
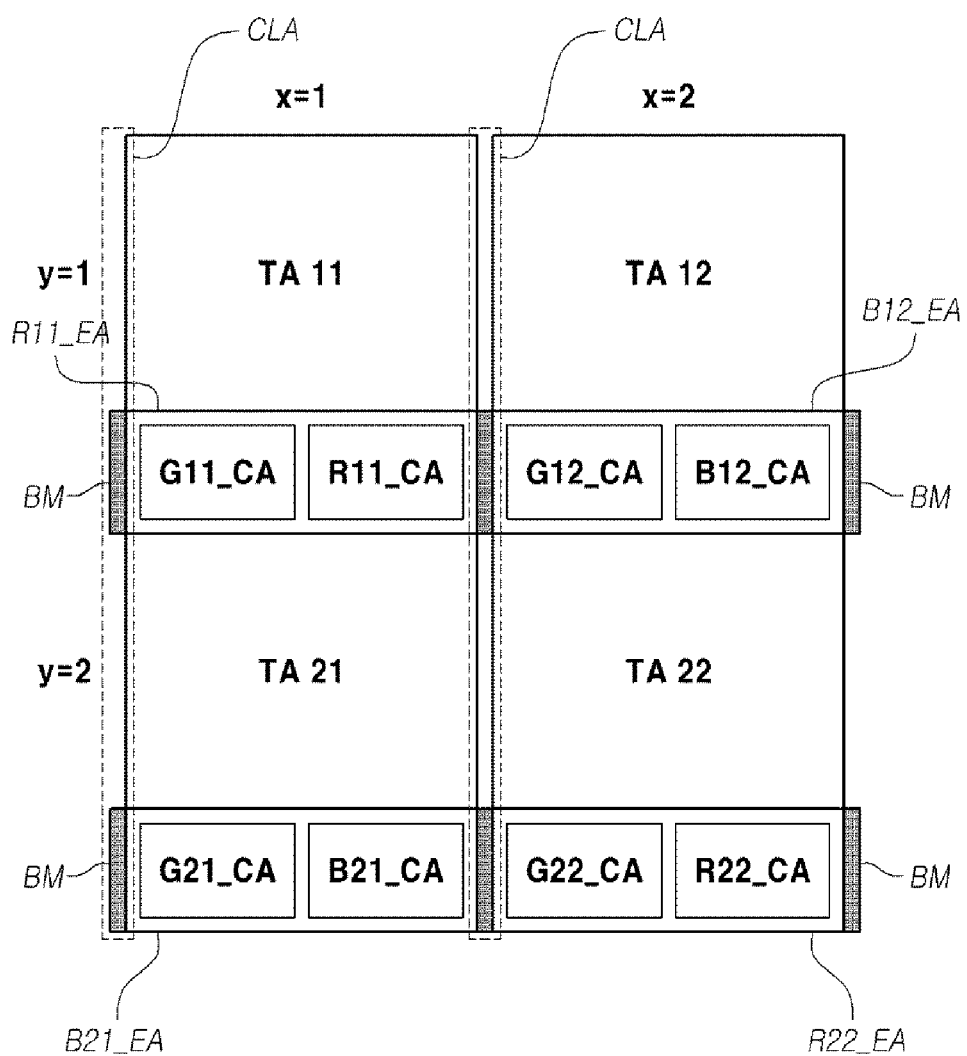
FIG. 14 illustrates the arrangement of circuit parts according to colors in the transparent display panel according to the second embodiment.

FIG. 14 illustrates the arrangement of circuit parts according to colors in the transparent display panel 110 according to the second embodiment.

As described above with reference to FIG. 12, the circuit arrangement areas (CA 11, CA 12, CA 13, . . . , CA 21, CA 22, CA 23, . . . , CA 31, CA 32, CA 33, . . . ) in which circuit parts for sub-pixels are arranged are located between each of transparent part rows in the transparent display panel 110 according to the second embodiment.

Referring to FIG. 14, in the transparent display panel 110 according to the second embodiment, the second color circuit parts R11_CA and R22_CA of the second color sub-pixels R11 and R22 are located under the second color light-emitting parts R11_EA and R22_EA.

Further, the third color circuit parts B12_CA and B21_CA of the third color sub-pixels B12 and B21 are also located under the third color light-emitting parts B12_EA and B21_EA.

However, the first color circuit parts G11_CA and G22_CA of the first color sub-pixels G11 and G22 are not located under the first color light-emitting parts G11_EA and G22_EA.

Referring to FIG. 14, first color circuit parts G11_CA and G22_CA corresponding to the first color light-emitting part G11_EA vertically adjacent to the second color light-emitting parts R11_EA and R22_EA and second color circuit parts R11_CA and R22_CA corresponding to the second color light-emitting parts R11_EA and R22_EA are located under the second color light-emitting parts R11_EA and R22_EA.

That is, not only the second color circuit parts R11_CA and R22_CA but also the first color circuit parts G11_CA and G22_CA corresponding to the first color light-emitting part G11_EA located in the column line area (CLA) and vertically adjacent thereto are located in the second color sub-pixel areas R11 and R22.

Referring to FIG. 14, first color circuit parts G12_CA and G21_CA corresponding to the first color light-emitting parts G12_EA and G21_EA vertically adjacent to the third color light-emitting parts B12_EA and B21_EA and third color circuit parts B12_CA and B21_CA corresponding to the third color light-emitting parts B12_EA and B21_EA are located under the third color light-emitting parts B12_EA and B21_EA.

That is, not only the third color circuit parts B12_CA and B21_CA but also the first color circuit parts G12_CA and G21_CA corresponding to the first color light-emitting parts G12_EA and G21_EA located in the column line area (CLA) and vertically adjacent thereto are located in the third color sub-pixel areas B12 and B21.

As described above, the first color circuit parts G11_CA and G22_CA of the first color sub-pixels G11 and G22 are not located under the first color light-emitting parts G11_EA and G22_EA located in the column line area (CLA) between transparent part columns and are, instead, located under the second color light-emitting parts R11_EA and R22_EA and the third color light-emitting parts B12_EA and B21_EA which correspond to light-emitting parts of other color sub-pixels (the second color sub-pixels and the third color sub-pixels), thereby simplifying the structure of the area between the transparent part columns. As a result, it is possible to reduce the row-directional width of the areas between transparent part columns, i.e. the width of the column line area (CLA) and correspondingly increase the row-directional width (Wt) of the transparent parts, thereby enlarging the transparent area.

Figure 15:
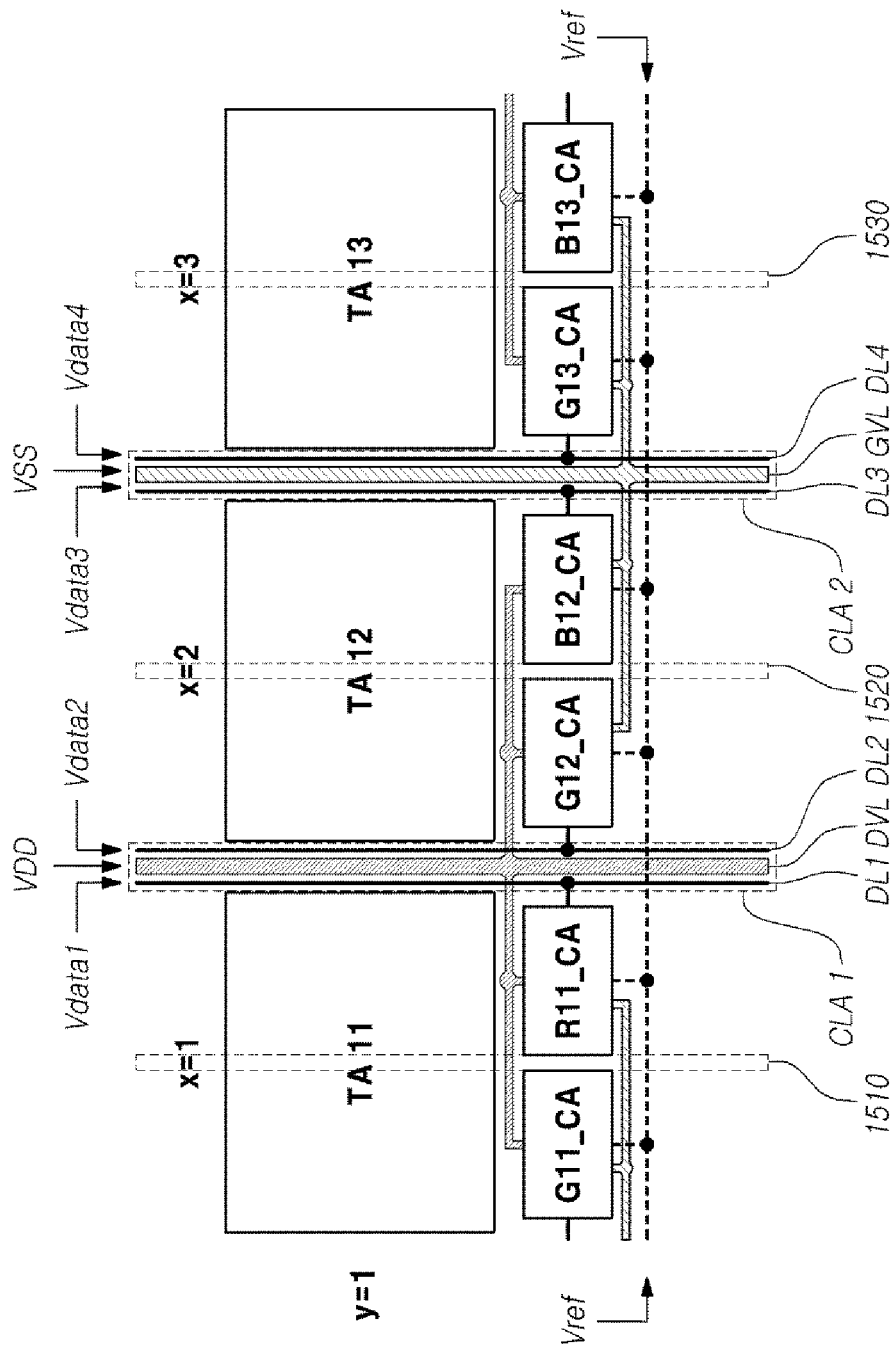
FIG. 15 illustrates a line arrangement of the transparent display panel according to the second embodiment.

FIG. 15 illustrates a line arrangement of the transparent display panel 110 according to the second embodiment.

Referring to FIG. 15, circuit parts of two colors are disposed at the column-directional side of an area in which one transparent part is located.

For example, a first color circuit part G11_CA and a second color circuit part R11_CA are disposed at the column-directional side of an area in which a transparent part TA11 is located. Further, a first color circuit part G12_CA and a third color circuit part B12_CA are disposed at the column-directional side of an area in which a transparent part TA12 is located.

Referring to FIG. 15, in the transparent display panel 110 according to the second embodiment, column lines are not arranged in areas 1510, 1520, and 1530 between circuit parts but are arranged in areas between transparent part columns, i.e. in the column line areas CLA1 and CLA2.

That is, the column lines DL1, DL2, DL3, DL4, DVL, and GVL do not exist in any of the area 1510 between the first color circuit part G11_CA and the second color circuit part R11_CA, the area 1520 between the first color circuit part G12_CA and the third color circuit part B12_CA, the area 1530 between the first color circuit part G13_CA and the second color circuit part R13_CA, but are arranged in areas CLA1 and CLA2 between two transparent parts.

Referring to FIG. 15, column lines including two data lines and at least one voltage line are arranged in the column line area CLA between two transparent part columns.

More specifically, column lines including two data lines DL1 and DL2 and driving voltage line DVL may be arranged in the column line area CLA1 between a transparent part column (TA11, TA21, TA31, . . . ) having a column number (x) of 1 and a transparent part column (TA12, TA22, TA32, . . . ) having a column number (x) of 2.

The data line DL1 may supply a data voltage (Vdata1) to the second color circuit part R11_CA. The data voltage (Vdata1) may be applied to a drain node or source node of a switching transistor of the second color circuit part R11_CA.

The data line DL2 may supply a data voltage (Vdata2) to the first color circuit part G12_CA. The data voltage (Vdata2) may be applied to a drain node or source node of a switching transistor (SWT) of the first color circuit part G12_CA.

The driving voltage line DVL may commonly supply a driving voltage VDD to a first color circuit part G11_CA and a second color circuit part R11_CA located at the left row-directional side of the column line area CLA1 and a first color circuit part G12_CA and a third color circuit part B12_CA located at the right row-directional side of the column line area CLA1. The driving voltage VDD is applied to third nodes (N3) of driving transistors (DRT) included in four circuit parts G11_CA, R11_CA, G12_CA, B12_CA, respectively.

As another example, column lines including two data lines DL3 and DL4 and base voltage line GVL may be arranged in the column line area CLA2 between a transparent part column (TA12, TA22, TA32, . . . ) having a column number (x) of 2 and a transparent part column (TA13, TA23, TA34, . . . ) having a column number (x) of 3.

The data line DL3 may supply a data voltage (Vdata3) to the third color circuit part B12_CA. The data voltage (Vdata3) may be applied to a drain node or source node of a switching transistor of the third color circuit part B12_CA.

The data line DL4 may supply a data voltage (Vdata4) to the first color circuit part G13_CA. The data voltage (Vdata2) may be applied to a drain node or source node of a switching transistor of the first color circuit part G13_CA.

The base voltage line GVL may commonly supply a base voltage VSS to a first color circuit part G12_CA and a third color circuit part B12_CA located at the left row-directional side of the column line area CLA2 and a first color circuit part G13_CA and a second color circuit part R13_CA located at the right row-directional side of the column line area CLA2. The base voltage VSS is applied to the second electrodes 706 of organic light-emitting diodes (OLED) included in four circuit parts G12_CA, B12_CA, G13_CA, and R13_CA, respectively.

As described above, in the structure in which circuit parts of two colors are located at the row-directional side of each of the areas in which the transparent parts TA11 and TA12 are disposed, column lines are not located in the areas 1510, 1520, and 1530 between the circuit parts of two colors but are located integrally in the areas CLA1 and CLA2 between the transparent part columns. As a result, the structure may have a wider transparent area.

Hereinafter, a transparent display panel 110 according to the third embodiment in which light-emitting parts of sub-pixels of two colors (second color and third color) are located in a column line area CLA between transparent part columns will be described with reference to FIGS. 16 and 17.

Figure 16:
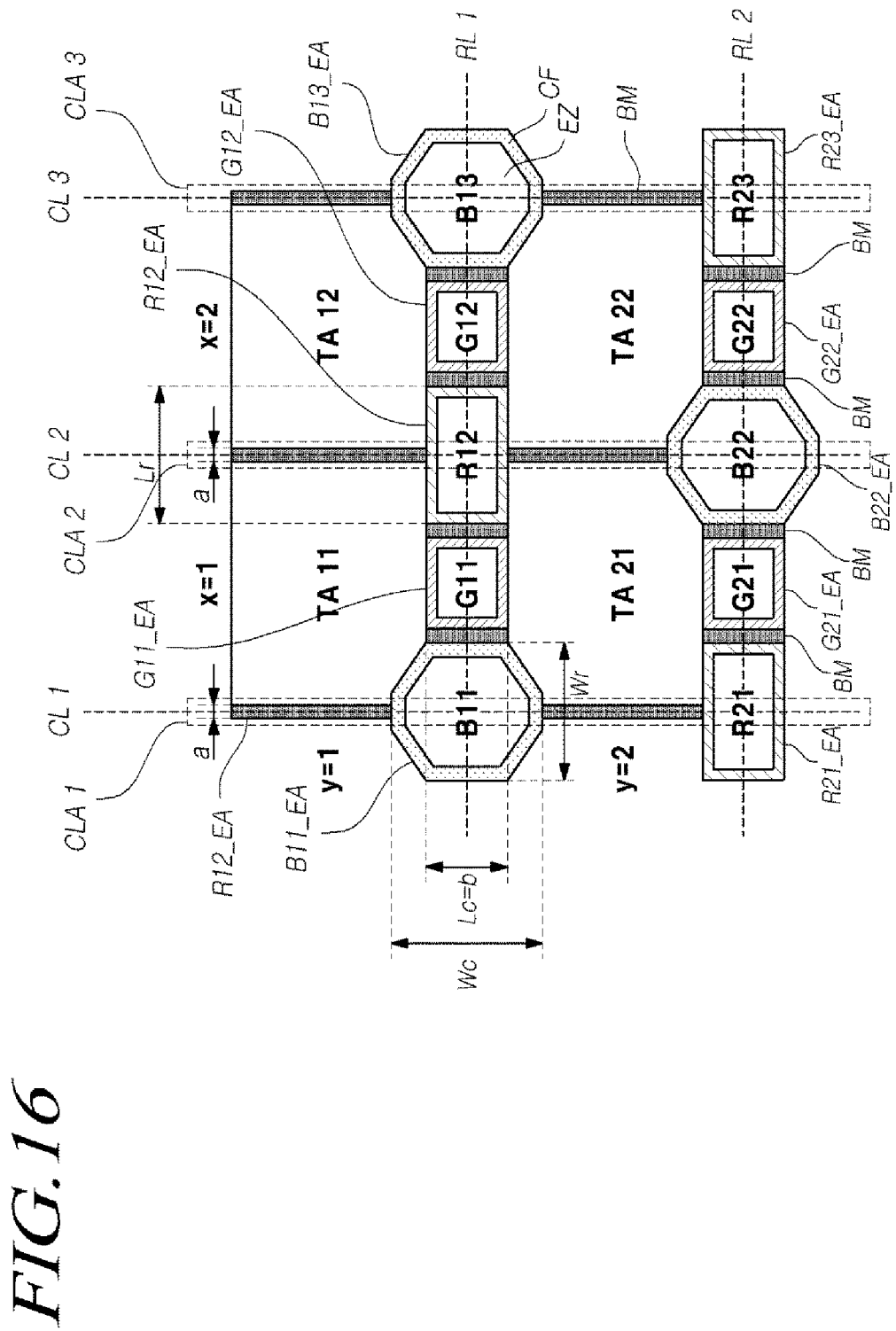
FIG. 16 is a plan view of a transparent display panel according to a third embodiment of the present invention.

FIG. 16 is a plan view of a transparent display panel 110 according to the third embodiment.

Referring to FIG. 16, the transparent display panel 110 according to the third embodiment includes a plurality of transparent parts (TA yx wherein y indicates a row number (=1, 2, and x indicates a column number (=1, 2, 3, . . . )) arranged in a matrix form. The transparent display panel 110 according to the third embodiment has, for example, an RG-BG structure.

In the transparent display panel 110 according to the third embodiment, first color light-emitting parts G11_EA, G12_EA, G21_EA, and G22_EA of first color sub-pixels G11, G12, G21, and G22 are arranged between transparent part rows.

Further, second color light-emitting parts R12_EA, R21_EA, and R23_EA of second color sub-pixels R12, R21, and R23 are located on column lines arranged in column line areas CLA1, CLA2, and CLA3.

Further, third color light-emitting parts B11_EA, B13_EA, and B22_EA of third color sub-pixels B11, B13, and B22 are located on column lines arranged in column line areas CLA1, CLA2, and CLA3.

That is, the second color light-emitting parts R12_EA, R21_EA, and R23_EA and the third color light-emitting parts B11_EA, B13_EA, and B22_EA overlap in the column line areas CLA1, CLA2, and CLA3.

Referring to FIG. 16, all of the first color light-emitting parts G11_EA, G12_EA, G21_EA, and G22_EA, the second color light-emitting parts R12_EA, R21_EA, and R23_EA, and the third color light-emitting parts B11_EA, B13_EA, and B22_EA are located in a single row line (RL1 or RL2) between two transparent part rows.

For example, all of the first color light-emitting parts G11_EA and G12_EA, the second color light-emitting parts R12_EA, and the third color light-emitting parts B11_EA and B13_EA are located in a row line (RL1) between a transparent part row (TA11, TA12, . . . ) having a row number (y) of 1 and a transparent part row (TA21, TA22, . . . ) having a row number (y) of 2.

Further, all of the first color light-emitting parts G21_EA and G22_EA, the second color light-emitting parts R21_EA and R23_EA, and the third color light-emitting parts B22_EA are located in a row line (RL2) between a transparent part row (TA21, TA22, . . . ) having a row number (y) of 2 and a next transparent part row.

As described above, even when light-emitting parts of all colors exist between transparent part rows, the second color light-emitting parts R12_EA, R21_EA, and R23_EA and the third color light-emitting parts B11_EA, B13_EA, and B22_EA overlap in the column line areas CLA1, CLA2, and CLA3, thereby enabling a wider area to be used for light-emitting. As a result, the light-emitting area can be further widened.

Referring to FIG. 16, second color light-emitting parts and third color light-emitting parts are alternately located in one column line (CL1, CL2, or CL3) between two transparent part columns.

For example, a second color light-emitting part R12_EA is disposed in a column line CL2 between a transparent part column (TA11, TA21, . . . ) having a column number (x) of 1 and a transparent part column (TA12, TA22, . . . ) having a column number (x) of 2, a third color light-emitting parts B22_EA is located next, and a second color light-emitting part R13_EA is located next.

As described above, the second color light-emitting parts R12_EA, R21_EA, and R23_EA and the third color light-emitting parts B11_EA, B13_EA, and B22_EA overlap in the column line areas CLA1, CLA2, and CLA3, and the second color light-emitting parts and the third color light-emitting parts are alternately located in one column line (CL1, CL2, or CL3) between two transparent part columns. As a result, it is possible to manufacture a transparent display panel 110 having a symmetric and regular pattern structure.

Meanwhile, referring to FIG. 16, the second color light-emitting parts R12_EA, R21_EA, and R23_EA have a row-directional width (Lr) larger than the width (a) of the column line areas CLA1, CLA2, and CLA3 and have a column-directional width (Lc) corresponding to the column-directional width (b) of the first color light-emitting parts G11_EA, G12_EA, G21_EA, and G22_EA.

Further, the third color light-emitting parts B11_EA, B13_EA, and B22_EA have the largest row-directional width (Wr) which is larger than the width (a) of the column line areas CLA1, CLA2, and CLA3 and have the largest column-directional width (Wc) which is larger than the column-directional width (b) of the first color light-emitting parts G11_EA, G12_EA, G21_EA, and G22_EA.

As a result, the light-emitting parts may have light-emitting areas, which are larger in a sequence of the third color light-emitting part B11_EA, B13_EA, and B22_EA, the second color light-emitting part R12_EA, R21_EA, and R23_EA, and the first color light-emitting part G11_EA, G12_EA, G21_EA, and G22_EA.

Meanwhile, circuit parts, which correspond to the first color light-emitting parts G11_EA, G12_EA, G21_EA, and G22_EA, the second color light-emitting parts R12_EA, R21_EA, and R23_EA, and the third color light-emitting parts B11_EA, B13_EA, and B22_EA, respectively, may be located under the first color light-emitting parts G11_EA, G12_EA, G21_EA, and G22_EA, the second color light-emitting parts R12_EA, R21_EA, and R23_EA, and the third color light-emitting parts B11_EA, B13_EA, and B22_EA, respectively.

Figure 17:
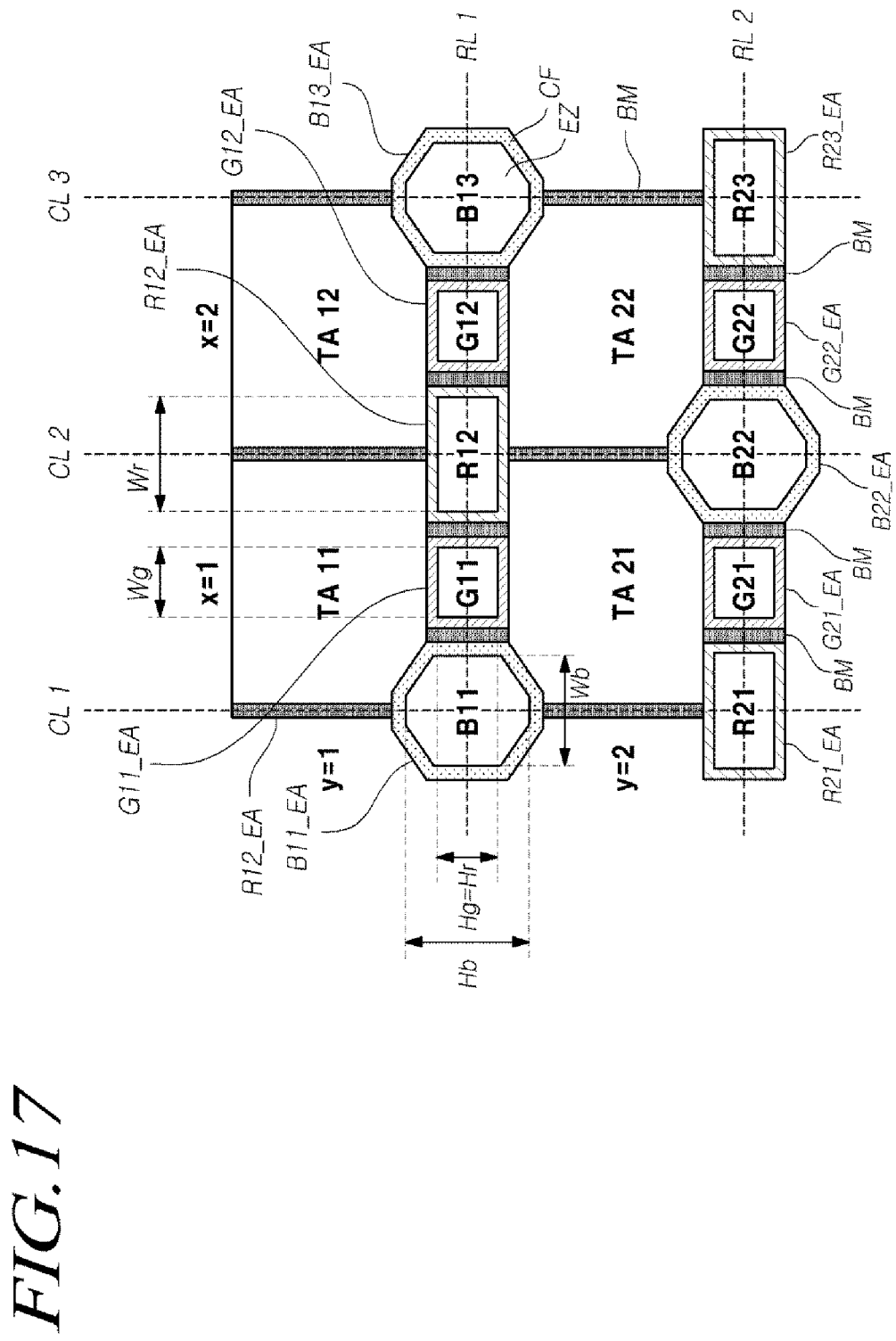
FIG. 17 is a view for describing light-emitting areas of the light-emitting parts according to colors in the transparent display panel according to the third embodiment.

FIG. 17 is a view for describing light-emitting areas of the light-emitting parts according to colors in the transparent display panel 110 according to the third embodiment.

Referring to FIG. 17, the light-emitting area (area of the light-emitting zone (EZ)) of the first color light-emitting parts G11_EA, G12_EA, G21_EA, and G22_EA is calculated by Wg*Hg.

The light-emitting area of the second color light-emitting parts R12_EA, R21_EA, and R23_EA is calculated by Wr*Hr. The light-emitting area of the third color light-emitting parts B11_EA, B13_EA, and B22_EA is larger than Wb*Hr and is smaller than Wb*Hb.

Hereinafter, the light-emitting area of the second color light-emitting parts R12_EA, R21_EA, and R23_EA and the light-emitting area of the first color light-emitting parts G11_EA, G12_EA, G21_EA, and G22_EA will be compared with each other.

Hereinafter, the column-directional width (Hr) of the light-emitting zone (EZ) of the second color light-emitting parts R12_EA, R21_EA, and R23_EA is identical or similar to the column-directional width (Hg) of the light-emitting zone (EZ) of the first color light-emitting parts G11_EA, G12_EA, G21_EA, and G22_EA.

However, the row-directional width (Wr) of the light-emitting zone (EZ) of the second color light-emitting parts R12_EA, R21_EA, and R23_EA is larger than the row-directional width (Wg) of the light-emitting zone (EZ) of the first color light-emitting parts G11_EA, G12_EA, G21_EA, and G22_EA.

Therefore, the light-emitting area of the second color light-emitting parts R12_EA, R21_EA, and R23_EA is larger than the light-emitting area of the first color light-emitting parts G11_EA, G12_EA, G21_EA, and G22_EA.

Next, the light-emitting area of the third color light-emitting parts B11_EA, B13_EA, and B22_EA and the light-emitting area of the second color light-emitting parts R12_EA, R21_EA, and R23_EA will be compared with each other.

Hereinafter, the row-directional width (Wb) of the light-emitting zone (EZ) of the third color light-emitting parts B11_EA, B13_EA, and B22_EA is identical or similar to the row-directional width (Wr) of the light-emitting zone (EZ) of the second color light-emitting parts R12_EA, R21_EA, and R23_EA.

Meanwhile, the column-directional width (Wb) of the light-emitting zone (EZ) of the third color light-emitting parts B11_EA, B13_EA, and B22_EA has a value equal to or larger than its least value Hg, which is identical or similar to the column-directional width (Hr) of the light-emitting zone (EZ) of the second color light-emitting parts R12_EA, R21_EA, and R23_EA, and has Hb as its maximum value. Therefore, the light-emitting area of the third color light-emitting parts B11_EA, B13_EA, and B22_EA is larger than the second color light-emitting parts R12_EA, R21_EA, and R23_EA.

In summary, among the first color light-emitting parts G11_EA, G12_EA, G21_EA, and G22_EA, the second color light-emitting parts R12_EA, R21_EA, and R23_EA, and the third color light-emitting parts B11_EA, B13_EA, and B22_EA, the second color light-emitting parts R12_EA, R21_EA and R23_EA and the third color light-emitting parts B11_EA, B13_EA, and B22_EA, which are located on the column lines, have a larger light-emitting area than the first color light-emitting parts G11_EA, G12_EA, G21_EA, and G22_EA, which are not located on the column lines.

Among the second color light-emitting parts R12_EA, R21_EA and R23_EA and the third color light-emitting parts B11_EA, B13_EA, and B22_EA, which are located on the column lines, the third color light-emitting parts B11_EA, B13_EA, and B22_EA have a larger light-emitting area than the second color light-emitting parts R12_EA, R21_EA and R23_EA. As a result, the third color light-emitting parts B11_EA, B13_EA, and B22_EA have the largest light-emitting area.

As described above, the third color light-emitting parts B11_EA, B13_EA, and B22_EA, which may be most probable to have problems, such as short lifespan or bad light-emitting efficiency, can be designed to have the largest light-emitting area. As a result, it is possible to further improve the lifespan and light-emitting efficiency of the transparent display panel 110.

Figure 18:
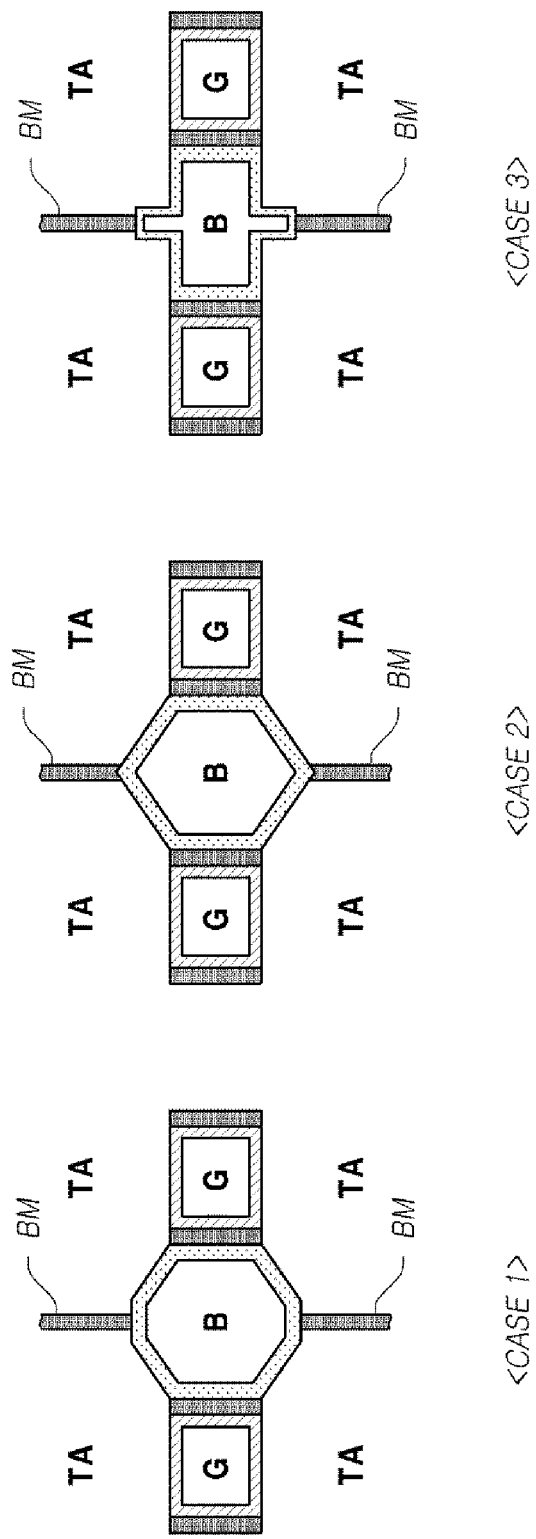
FIG. 18 illustrates an example of the shape of third color light-emitting parts for increasing the light-emitting area of the third color light-emitting parts in the transparent display panel according to the third embodiment.

FIG. 18 illustrates an example of the shape of third color light-emitting parts B11_EA, B13_EA, and B22_EA for increasing the light-emitting area of the third color light-emitting parts B11_EA, B13_EA, and B22_EA in the transparent display panel 110 according to the third embodiment.

As described above, the third color light-emitting parts B11_EA, B13_EA, and B22_EA . . . have the largest light-emitting area in the transparent display panel 110 according to the third embodiment.

To this end, as shown in FIG. 18, the third color light-emitting parts B11_EA, B13_EA, and B22_EA . . . may have an octagonal shape (case 1), a hexagonal shape (case 2), or a shape of "+" (case 3) while overlapping the column line areas CLA1, CLA2, and CLA3.

That is, an anode electrode, a color filter, etc. formed in the third color light-emitting parts B11_EA, B13_EA, and B22_EA . . . may have an octagonal shape (case 1), a hexagonal shape (case 2), or a shape of "+" (case 3).

As described above, the embodiments of the present invention can provide various shapes (octagonal shape, hexagonal shape, or a shape of "+") for the third color light-emitting parts B11_EA, B13_EA, and B22_EA . . . so that the third color light-emitting parts B11_EA, B13_EA, and B22_EA . . . can have the largest light-emitting area.

According to the embodiments of the present invention described above, it is possible to provide a transparent display panel 110 and a transparent display device 100 including the panel, which have a structure capable of securing a wide light-emitting area without degrading the transparency thereof.

Further, according to the present embodiments, it is possible to provide a transparent display panel 110 and a transparent display device 100 including the panel, which have a light-emitting part arrangement structure allowing a wide transparent area and a wide light-emitting area.

Further, according to the present embodiments, it is possible to provide a transparent display panel 110 and a transparent display device 100 including the panel, which have a line arrangement structure allowing a wide transparent area and a wide light-emitting area.

Further, according to the present embodiments, it is possible to provide a transparent display panel 110 and a transparent display device 100 including the panel, which have a circuit part arrangement structure allowing a wide transparent area and a wide light-emitting area.

Further, according to the present embodiments, it is possible to provide a transparent display panel 110 and a transparent display device 100 including the panel, which can widen the viewing angle while allowing a wide transparent area and a wide light-emitting area.

Further, according to the present embodiments, it is possible to provide a transparent display panel 110 and a transparent display device 100 including the panel, which can widen the viewing angle while allowing a wide transparent area and a wide light-emitting area, even without a change in another structure such as a cell gap.

Further, according to the present embodiments, it is possible to provide a transparent display panel 110 and a transparent display device 100 including the panel, which have a 2P-4SP structure capable of improving the light-emitting efficiency, viewing angle characteristic, and transparency.

The above description and the accompanying drawings provide an example of the technical idea of the present invention for illustrative purposes only. Those having ordinary knowledge in the technical field, to which the present invention pertains, will appreciate that various modifications and changes in form, such as combination, separation, substitution, and change of a configuration, are possible without departing from the essential features of the present invention. Accordingly, the embodiments disclosed in the present invention are merely to not limit but describe the technical spirit of the present invention. Further, the scope of the technical spirit of the present invention is limited by the embodiments. The scope of the present invention shall be construed on the basis of the accompanying claims in such a manner that all of the technical ideas included within the scope equivalent to the claims belong to the present invention.

What is claimed is:

1. A transparent display device comprising:
    a transparent display panel in which a plurality of pixels are arranged, each pixel including a plurality of sub-pixels each having a light-emitting part and a circuit part, the plurality of sub-pixels including a first color sub-pixel, a second color sub-pixel, and a third color sub-pixel; and
    a driver for driving the plurality of sub-pixels,
    wherein the transparent display panel includes a plurality of transparent parts arranged in a form of a matrix, thereby forming a plurality of transparent part rows and a plurality of transparent part columns,
    wherein the first color sub-pixel and column lines are disposed in a column line area positioned between two neighboring transparent part columns among the plurality of transparent part columns,
    wherein the light-emitting part of a sub-pixel of at least one color is located in or overlaps the column line area,
    wherein the second color sub-pixel and the third color sub-pixel are arranged in a row direction between two neighboring transparent part rows among the plurality of transparent part rows, and
    wherein a black matrix is selectively disposed only between two neighboring first color sub-pixels in the column line area among the plurality of sub-pixels.

2. The transparent display device of claim 1,
    wherein the sub-pixel of the at least one color which is located in or overlaps the column line area forms an angle with at least one sub-pixel located in a first transparent part column.

3. The transparent display device of claim 2,
    wherein the sub-pixel of the at least one color which is located in or overlaps the column line area runs substantially perpendicular to the at least one sub-pixel located in the first transparent part column.

4. The transparent display device of claim 1,
    wherein at least a portion of the light-emitting part of the sub-pixel of at least one color overlapping with at least a portion of the column lines is free of a black matrix.

5. The transparent display device of claim 1,
    wherein the sub-pixel of at least one color located in or overlapping the column line area is a first sub-pixel, and
    wherein at least one sub-pixel located in a first transparent part column is a second sub-pixel.

6. The transparent display device of claim 5,
    wherein the first sub-pixel is of a first color, and the second sub-pixel is of a second color different from the first color.

7. The transparent display device of claim 6, further comprising:
    a third sub-pixel of a third color located in a second transparent part column adjacent to the first transparent part column.

8. The transparent display device of claim 7,
    wherein the first color is green,
    wherein the second color is red, and
    wherein the third color is blue.

9. The transparent display device of claim 7,
    wherein the first color is blue,
    wherein the second color is green, and
    wherein the third color is red.

10. The transparent display device of claim 6, further comprising:
    a third sub-pixel of a third color located in or overlapping a further column line area arranged at the opposite side of the first transparent part column as the column line area,
    wherein the third sub-pixel is arranged adjacent to the second sub-pixel.

11. The transparent display device of claim 10,
    wherein the first color is green,
    wherein the second color is red, and
    wherein the third color is blue.

12. The transparent display device of claim 10,
wherein the first color is blue,
wherein the second color is green, and
wherein the third color is red.

13. The transparent display device of claim 10,
wherein an area of the first sub-pixel is larger than an area of the second sub-pixel and/or the third sub-pixel.

14. The transparent display device of claim 1,
wherein the column lines are arranged in an opaque column line area between adjacent transparent part columns.

15. The transparent display device of claim 1,
wherein respective two pixels are formed by four sub-pixels.

16. The transparent display device of claim 5,
wherein a circuit part of the first sub-pixel is disposed below the second sub-pixel.

17. The transparent display device of claim 1,
wherein the plurality of sub-pixels of at least some of the pixels are arranged in one common row.

* * * * *